(12) United States Patent
Iwasaki

(10) Patent No.: US 8,182,869 B2
(45) Date of Patent: May 22, 2012

(54) METHOD FOR CONTROLLING TEMPERATURE OF A MOUNTING TABLE

(75) Inventor: Masahide Iwasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 12/781,527

(22) Filed: May 17, 2010

(65) Prior Publication Data

US 2010/0224355 A1    Sep. 9, 2010

Related U.S. Application Data

(62) Division of application No. 11/393,866, filed on Mar. 31, 2006, now Pat. No. 7,789,962.

(60) Provisional application No. 60/666,709, filed on Mar. 31, 2005.

(30) Foreign Application Priority Data

Mar. 31, 2005 (JP) ................................ 2005-101767

(51) Int. Cl.
*C23C 16/00* (2006.01)

(52) U.S. Cl. ................ 427/248.1; 427/398.1; 427/398.3

(58) Field of Classification Search ............... 427/248.1, 427/398.1, 398.3
See application file for complete search history.

(56) References Cited

U.S. PATENT DOCUMENTS

| | | | | |
|---|---|---|---|---|
| 5,607,009 | A * | 3/1997 | Turner et al. | 165/48.1 |
| 5,674,786 | A * | 10/1997 | Turner et al. | 438/758 |
| 6,217,705 | B1 * | 4/2001 | Tamura et al. | 156/345.53 |
| 6,669,783 | B2 * | 12/2003 | Sexton et al. | 118/728 |
| 6,908,512 | B2 * | 6/2005 | Ivanov et al. | 118/503 |
| 7,094,703 | B2 * | 8/2006 | Kobayashi | 438/709 |
| 7,146,744 | B2 * | 12/2006 | Kobayashi | 34/62 |
| 2003/0155939 | A1 * | 8/2003 | Lutz et al. | 324/760 |
| 2004/0052963 | A1 * | 3/2004 | Ivanov et al. | 427/443.1 |
| 2004/0187787 | A1 | 9/2004 | Dawson et al. | |
| 2005/0045104 | A1 | 3/2005 | Arai et al. | |
| 2005/0217799 | A1 * | 10/2005 | O'Meara et al. | 156/345.52 |
| 2007/0089834 | A1 | 4/2007 | Brillhart et al. | 156/345.27 |
| 2011/0079367 | A1 * | 4/2011 | Sasaki | 165/61 |
| 2011/0085399 | A1 * | 4/2011 | Chen et al. | 365/226 |

FOREIGN PATENT DOCUMENTS

| | | |
|---|---|---|
| JP | 62-1017 | 1/1987 |
| JP | 3-291469 | 12/1991 |
| JP | 5-133662 | * 5/1993 |
| JP | 6-37056 | 2/1994 |
| JP | 2000-216140 | 8/2000 |
| JP | 2002-76103 | 3/2002 |
| JP | 2003-294322 | 10/2003 |

OTHER PUBLICATIONS

Smith, W.F., et al., "Cryogenic substrate cooling of substrate heating without vacuum feedthroughs". J. Vac. Sci. Technol. A, vol. 18, No. 1, Jan./Feb. 2000.*

Olynick, Deirdre, et al., "Substrate cooling efficiency during cryogenic inductively coupled plasma polymer etching for diffractive optics on membranes". J. Vac. Sci. Technol. B, vol. 19, No. 6, Nov./Dec. 2001.*

Abe, Yoshio, et al., "Effects of Substrate Cooling during Sputter Deposition of Hydrogen-Containing Ta2O5 Thin Films in H2O Atmosphere on their Ion Conductivity". Japanese Journal of Applied Physics, vol. 47, No. 9, 2008, pp. 7269-7271.*

Translation of JP 5-133662.*

* cited by examiner

*Primary Examiner* — Bret Chen

(74) *Attorney, Agent, or Firm* — Oblon, Spivak, McClelland, Maier & Neustadt, L.L.P.

(57) ABSTRACT

A method for controlling a temperature of a mounting table includes a first and a second temperature control mode in which a first and a second coolant passageway of a coolant circulator are connected in parallel between an output port and a return port of the coolant circulator. The first temperature control mode includes: making a part of a coolant of a reference temperature flow in the first coolant passageway after raising or lowering the temperature thereof to a desired set temperature; and making a residual coolant flow in the second coolant passageway while substantially maintaining the reference temperature thereof. The second temperature control mode includes: making a part of the coolant flow in the first coolant passageway while substantially maintaining the reference temperature thereof; and making a residual coolant flow in the second coolant passageway while substantially maintaining the reference temperature thereof.

8 Claims, 14 Drawing Sheets

MODE (A)

MODE (A)

MODE (B)

MODE (B)

METHOD FOR CONTROLLING TEMPERATURE OF A MOUNTING TABLE

CROSS-REFERENCE TO RELATED APPLICATIONS

The present application is a divisional application of and claims priority to U.S. application Ser. No. 11/393,866, filed Mar. 31, 2006 and issued Sep. 7, 2010 as U.S. Pat. No. 7,789,962, which claims the benefit of U.S. Provisional Application 60/666,709, filed Mar. 31, 2005, of which the entire contents are hereby incorporated by reference. The present application also claims priority via the '866 application to Japanese Application 2005-101767, filed Mar. 31, 2005.

FIELD OF THE INVENTION

The present invention relates to a technique for controlling a temperature of a mounting table for mounting thereon an object to be processed; and, more particularly, to a device and a method for variously selecting or controlling a temperature and a temperature distribution of a mounting table and a processing apparatus including the same.

BACKGROUND OF THE INVENTION

When a semiconductor substrate or a liquid crystal panel is microprocessed by using a plasma, it is extremely crucial to control, for example, a temperature distribution, a plasma density distribution and a reaction product distribution on the substrate to be processed. If such distributions are not properly controlled, it is difficult to secure process uniformity on a surface of the substrate, thereby deteriorating a production yield of a semiconductor device or a display device.

Generally, a mounting table (support table) for mounting thereon a substrate to be processed inside a chamber of a plasma processing apparatus functions as a high frequency electrode for applying a high frequency power to a plasma space, as a support member for supporting a substrate, e.g., by an electrostatic adsorption and as a heat plate for controlling the substrate at a predetermined temperature by heat conduction. The mounting table serving as the heat plate is required to properly compensate a heat distribution caused by a substrate supporting structure or a heat input characteristic distribution on the substrate caused by nonuniformity of a radiant heat from a plasma and a chamber wall.

Conventionally, in order to control a temperature of a mounting table, there has been widely used a method for supplying a coolant whose temperature is controlled by a chiller unit into a coolant channel (passageway) provided inside the mounting table to be circulated therein. Since the chiller unit is disposed in a facility area separately provided from a clean room where a processing apparatus is installed, the length of a line for connecting the chiller unit and the mounting table in the chamber can be at least a few meters and sometime can exceed 10 m.

Recently, in a plasma processing, a trend towards miniaturization and diversification of processing requires various profiles for a temperature distribution of a mounting table. However, in most applications, a temperature control is required to have a proper balance between a central portion and a peripheral portion of the mounting table to achieve an in-surface uniformity of the processing performed on a substrate. As for a prior art capable of meeting such demand, there is known a technique for supplying coolants whose temperatures are controlled independently by two chiller units into coolant channels respectively provided at a central portion and at a peripheral portion in the mounting table to be circulated therein, thereby independently controlling respective temperatures of the central portion and the peripheral portion of the mounting table (see, e.g., Japanese Patent Laid-open Application No. H6-37056).

However, the aforementioned prior art requires two chiller units, which is inefficient in terms of cost and space and further has poor responsiveness in a temperature control. In other words, since a thermal capacity of the chiller unit itself is considerably large, it is difficult to rapidly change a temperature of a coolant. Moreover, due to a considerably long length of the line (channel) from the chiller unit to the mounting table, the temperature can neither be raised nor lowered at a high speed. Recently, for example, a plasma etching process requires a method for successively processing a multilayer film on a substrate to be processed inside a single chamber instead of multiple chambers used conventionally. In order to implement such method by using a single chamber, at a time of changing a target film, it is essential to have a technique to change a temperature of the substrate in a short period, i.e., a technique to raise or lower the temperature of the mounting table at a high speed.

In addition, a method may be proposed for controlling a temperature distribution of a mounting table by a heating element, e.g., a heater, a thermally conductive element or the like, embedded in the mounting table. However, this method raises a running cost, can influence on a function of a high frequency electrode and complicates an inner structure of the mounting table and, therefore, it is impractical.

SUMMARY OF THE INVENTION

It is, therefore, a primary object of the present invention to provide a comparatively small-scaled, simple and practical device for variously controlling a temperature and a temperature distribution of a mounting table with high accuracy while raising or lowering the temperature thereof at a high speed, a method and a program therefor.

It is another object of the present invention to provide a processing apparatus for improving uniformity and diversity of a processing performed on a target object by controlling the temperature of the mounting table.

In accordance with the present invention, there is provided a device for controlling a temperature of a mounting table for mounting thereon a target object, the device including a first and a second coolant passageway provided at the mounting table, each having an inlet and an outlet; a coolant circulator having an output port connected to the inlet of the first coolant passageway via a first channel and a return port connected to the outlet of the second coolant passageway via a second channel, for circulating a coolant in the first and the second coolant passageway and outputting the coolant that has returned to the return port through the output port after restoring a temperature of the coolant to a reference temperature; a coolant temperature controller provided in the middle of the first channel, for raising or lowering the temperature of the coolant from the reference temperature to a desired set temperature; a channel switching unit having a first port connected to the outlet of the first coolant passageway via a third channel, a second port connected to a first branchpoint provided at an upstream side of the coolant temperature controller of the first channel via a fourth channel, a third port connected to the inlet of the second coolant passageway via a fifth channel and a fourth port connected to a second branchpoint provided in the second channel via a sixth channel, the channel switching unit for connecting, blocking and changing the channels among the first to the fourth port; and a channel controller for connecting, blocking and changing the channels inside the channel switching unit.

The aforementioned configuration combines a function of controlling the temperature of the coolant circulating in the first and the second coolant passageway at a reference temperature with the coolant circulator, a function of raising/lowering the temperature of the coolant from the reference temperature with the coolant temperature controller provided in the middle of the first channel, and a function of switching a connection relationship between the coolant circulator and the first and the second coolant passageway with the channel switching unit. Accordingly, it is possible to variously select the temperature of the coolant supplied to the first and the second coolant passageway and further to variously and precisely control the temperature or the temperature distribution of the mounting table. Herein, it is sufficient to have a single coolant circulator.

In the device, preferably, the channel switching unit has a first opening/closing valve connected between the first port and the third port, a second opening/closing valve connected between the first port and the fourth port, a third opening/closing valve connected between the second port and the third port and a fourth opening/closing valve connected between the second port and the fourth port, and the channel controller controls on/off operations of the first to the fourth opening/closing valve. In this configuration, the on/off operation of the respective opening/closing valves may be separately or alternately executed. For example, it is possible to configure the first and the third opening/closing valves as normal open valves and the second and the fourth opening/closing valves as normal close valves. It may be configured that the channel switching unit has a first direction switching valve for connecting the first port to either the third or the fourth port and a second direction switching valve for connecting the second port to either the third or the fourth port, and the channel controller controls states of respective channels inside the first and the second direction switching valve.

Further, preferably, the coolant temperature controller includes an inline heater attached to the first channel; a temperature sensor provided at a downstream side of the inline heater, for detecting a coolant temperature in the first channel; and a temperature controller for controlling a heat discharge rate of the inline heater so that the coolant temperature detected by the temperature sensor becomes equal to a set temperature. In accordance with such configuration, the temperature can be raised/lowered at a high speed by effectively heating or cooling the coolant flowing in the first channel. Further, in order to more effectively raise/lower the temperature at a high speed, the inline heater may heat a coolant in the first channel at a place near to the mounting table.

Further, preferably, the device may include a flow rate control valve provided at a downstream side of the first branchpoint of the first channel, for variably controlling a flow rate of the coolant. As for such flow rate control valve, it is preferable to use a manually or mechanically operated variable throttle valve, for example. In general, when the heating or the cooling applied to the coolant flowing in the line is uniformly maintained, the coolant temperature can be significantly raised by reducing the flow rate due to an inversely proportional relationship between the flow rate and the up/down of the temperature of the coolant. Therefore, by combining the heating control operation of the heater or the endothermic control operation of the heat absorbing part with the coolant flow rate control operation of the flow rate control valve, the coolant temperature can be precisely and rapidly raised/lowered from the base temperature to a desired set temperature.

Further, preferably, the first and the second coolant passageway are concentrically disposed about a center of the mounting table and, more preferably, the first coolant passageway is provided in a central region of the mounting table, whereas the second coolant passageway is provided in a peripheral region of the mounting table. Furthermore, preferably, the coolant circulator includes a pump for circulating a coolant, a freezer for freezing the coolant that has just returned and a heater for heating the frozen coolant to a predetermined reference temperature.

In accordance with the present invention, there is provided a first method for controlling a temperature of a mounting table by circulating a coolant coming out of a coolant circulator in a first and a second coolant passageway provided at the mounting table for mounting thereon a target object, the method including a first temperature control mode including the steps of connecting the first coolant passageway and the second coolant passageway in parallel between an output port and a return port of the coolant circulator; making a part of the coolant of a reference temperature outputted from the coolant circulator flow in the first coolant passageway after raising or lowering the temperature thereof to a desired set temperature; and making a residual coolant flow in the second coolant passageway while substantially maintaining the reference temperature thereof.

In accordance with this method, with a single coolant circulator, it is possible to make a coolant of a reference temperature flow in the second coolant passageway and a coolant of a set temperature different from the reference temperature flow in the first coolant passageway. And, also, it is possible to vary the temperature distribution of the mounting table. Moreover, since only the coolant flowing in the first coolant passageway needs to be heated or cooled right before it is made to flow therein, the temperature can be raised/lowered at a high speed with the high heating/cooling efficiency.

Preferably, the method further includes a second temperature control mode including the steps of connecting the first coolant passageway and the second coolant passageway in parallel between the output port and the return port of the coolant circulator; making a part of the coolant outputted from the coolant circulator flow in the first coolant passageway while substantially maintaining the reference temperature thereof; and making a residual coolant flow in the second coolant passageway while substantially maintaining the reference temperature thereof, wherein the first and the second temperature control mode may be switched depending on processing conditions for the target object.

In the second temperature control mode, the coolant of the reference temperature is supplied from the coolant circulator to the first and the second coolant passage, thereby enabling to obtain an approximately flat (uniform) temperature distribution of the mounting table. The switching between a first normal state corresponding to the first temperature control mode and a second normal state corresponding to the second temperature control mode can be executed in a shorter period of time than the time needed to raise/lower the temperature of the mounting table (object to be processed) at a high speed.

Preferably, the method further includes a third temperature control mode including the steps of connecting the first coolant passageway and the second coolant passageway in series between the output port and the return port of the coolant circulator; making a part of the coolant of a reference temperature outputted from the coolant circulator flow in the first and the second coolant passageway sequentially after raising or lowering the temperature thereof to a desired set temperature; and making a residual coolant bypass the coolant passageways, wherein the first to the third temperature control mode may be switched depending on processing conditions for the target object.

In the third temperature control mode, the coolant of the set temperature different from the reference temperature is supplied to the first and the second coolant passage, thereby enabling to obtain an approximately flat temperature distribution corresponding to the set temperature on the mounting table. The switching among the first to the third normal state corresponding to the first to the third temperature control mode can be executed in a shorter period of time than the time needed to raise/lower the temperature of the mounting table (object to be processed) at a high speed. Especially, when it is switched to the third temperature control mode, the coolant flow rate supplied to both coolant passageways can be variably and stably controlled at a high speed due to an operation of the bypass channel.

Preferably, the method further includes a fourth temperature control mode including the steps of connecting the first coolant passageway and the second coolant passageway in series between the output port and the return port of the coolant circulator; and making the entire coolant of the reference temperature outputted from the coolant circulator flow in the first and the second coolant passageway sequentially after raising or lowering the temperature thereof to a desired set temperature; wherein the first, the second and the fourth temperature control mode may be switched depending on processing conditions for the target object.

In the fourth temperature control mode, the coolant of the set temperature different from the reference temperature is supplied to the first and the second coolant passage, thereby enabling to obtain an approximately flat temperature distribution corresponding to the set temperature of the mounting table. The switching among the first, the second and the fourth normal state corresponding to the first, the second and the fourth temperature control mode can be executed in a shorter period of time than the time needed to raise/lower the temperature of the mounting table (object to be processed) at a high speed.

Preferably, the method further includes a fifth temperature control mode including the steps of connecting the first coolant passageway and the second coolant passageway in series between the output port and the return port of the coolant circulator; making a part of the coolant outputted from the coolant circulator flow in the first and the second coolant passageway sequentially while substantially maintaining the reference temperature thereof; and making a residual coolant bypass the coolant passageways, wherein the first, the third or the fourth, and the fifth temperature control mode may be switched depending on processing conditions for the target object.

In the fifth temperature control mode, the coolant of the reference temperature is supplied to the first and the second coolant passage, thereby enabling to obtain an approximately flat temperature distribution corresponding to the reference temperature of the mounting table. Further, the coolant flow rate supplied to both coolant passageways can be variably and stably controlled at a high speed due to the operation of the bypass channel. The switching among the first, the third, the fourth and the fifth normal state corresponding to the first, the third, the fourth and the fifth temperature control mode can be executed in a shorter period of time than the time needed to raise/lower the temperature of the mounting table (object to be processed) at a high speed.

Preferably, the method further includes a sixth temperature control mode including the steps of connecting the first coolant passageway and the second coolant passageway in series between the output port and the return port of the coolant circulator; and making the entire coolant outputted from the coolant circulator flow in the first and the second coolant passageway sequentially while substantially maintaining the reference temperature thereof, wherein the first, the third or the fourth, and the sixth temperature control mode may be switched depending on processing conditions for the target object.

In a sixth temperature control mode, the coolant of the reference temperature is supplied to the first and the second coolant passage, thereby enabling to obtain an approximately flat temperature distribution corresponding to the reference temperature of the mounting table. The switching among the first, the third, the fourth and the sixth normal state corresponding to the first, the third, the fourth and the sixth temperature control mode can be executed in a shorter period of time than the time needed to raise/lower the temperature of the mounting table (object to be processed) at a high speed.

In accordance with the present invention, there is provided a second method for controlling a temperature of a mounting table by circulating a coolant with a coolant circulator in a first and a second coolant passageway provided at the mounting table for mounting thereon a target object, the method including a first temperature control mode for controlling the temperature of the mounting table by connecting the first coolant passageway and the second coolant passageway in parallel between an output port and a return port of the coolant circulator, making a part of the coolant of a reference temperature outputted from the coolant circulator flow in the first coolant passageway after raising or lowering the temperature thereof to a desired set temperature, and making a residual coolant flow in the second coolant passageway while substantially maintaining the reference temperature thereof; a second temperature control mode for controlling the temperature of the mounting table by connecting the first coolant passageway and the second coolant passageway in parallel between the output port and the return port of the coolant circulator, making a part of the coolant outputted from the coolant circulator flow in the first coolant passageway while substantially maintaining the reference temperature thereof, and making a residual coolant flow in the second coolant passageway while substantially maintaining the reference temperature thereof; a third temperature control mode for controlling the temperature of the mounting table by connecting the first coolant passageway and the second coolant passageway in series between the output port and the return port of the coolant circulator, and making a part of the coolant of a reference temperature outputted from the coolant circulator flow in the first and the second coolant passageway sequentially after raising or lowering the temperature thereof to a desired set temperature, and making a residual coolant bypass the coolant passageways; a fifth temperature control mode for controlling the temperature of the mounting table by connecting the first coolant passageway and the second coolant passageway in series between the output port and the return port of the coolant circulator, making a part of the coolant outputted from the coolant circulator flow in the first and the second coolant passageway sequentially while substantially maintaining the reference temperature thereof, and bypassing a residual coolant, wherein the method performs a switching between the first mode and at least one of the second, the third and the fifth mode.

In accordance with the second method, the mode is switched between the first mode and a single mode or a plurality of modes selected among the second, the third and the fifth mode. In the second method as well as in the first method, it is possible to vary the temperature distribution of the mounting table and also easily raise/lower the temperature thereof at a high speed.

In accordance with the present invention, there is provided a processing apparatus including a depressurizable chamber for accommodating therein a mounting table for mounting thereon a target object; the above-described device, for controlling a temperature of the mounting table; a gas exhaust unit for exhausting the chamber; and a processing gas supply unit for supplying a processing gas into the chamber. In the configuration of the processing apparatus, by using the temperature control device, it is possible to control the temperature and the temperature distribution of the target object disposed on the mounting table with high accuracy.

Preferably, the apparatus further includes a plasma source for generating or supplying a plasma of the processing gas in the chamber or a first high frequency power supply unit for supplying a first high frequency power. Preferably, the apparatus further includes a facing electrode facing the mounting table in the chamber and a second high frequency power supply unit for supplying a second high frequency power to the facing electrode.

Preferably, the mounting table includes an electrostatic chuck for electrostatically adsorbing the target object and a thermally conductive gas supply line for supplying a thermally conductive gas between a backside surface of the target object and a mounting surface.

Preferably, the coolant temperature controller raises a temperature of the target object to a set processing temperature by heating a coolant flowing in the first channel before a desired plasma processing is performed on the target object and, then, the coolant temperature controller gradually reduces the heating for the coolant flowing in the first channel so that the temperature of the target object is substantially maintained at the set processing temperature until the processing is completed. In other words, it is possible to correct the wafer temperature change (increase) caused by the heat from the plasma or the like and further to improve a temperature management, a reproducibility and a production yield in a single wafer plasma processing.

Moreover, in the present invention, the reference temperature of the coolant outputted from the coolant circulator is neither uniform nor maintained at a single value. The reference temperature thereof fluctuates around a predetermined value within a tolerance range.

In accordance with the device and the method for controlling a temperature of a mounting table and the program therefor of the present invention, with the aforementioned comparatively small-scaled, simple and practical composition and operation, a temperature and a temperature distribution of the mounting table can be variously controlled with high accuracy and, further, the temperature of the mounting table can be increased/decreased at a high speed. Moreover, in accordance with the processing apparatus of the present invention, with the aforementioned composition and the operation, the uniformity or the diversity in processing an object to be processed can be improved by controlling the temperature of the mounting table.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of the present invention will be described in detail with reference to the accompanying drawings.

[Embodiment 1]

Figure 1:
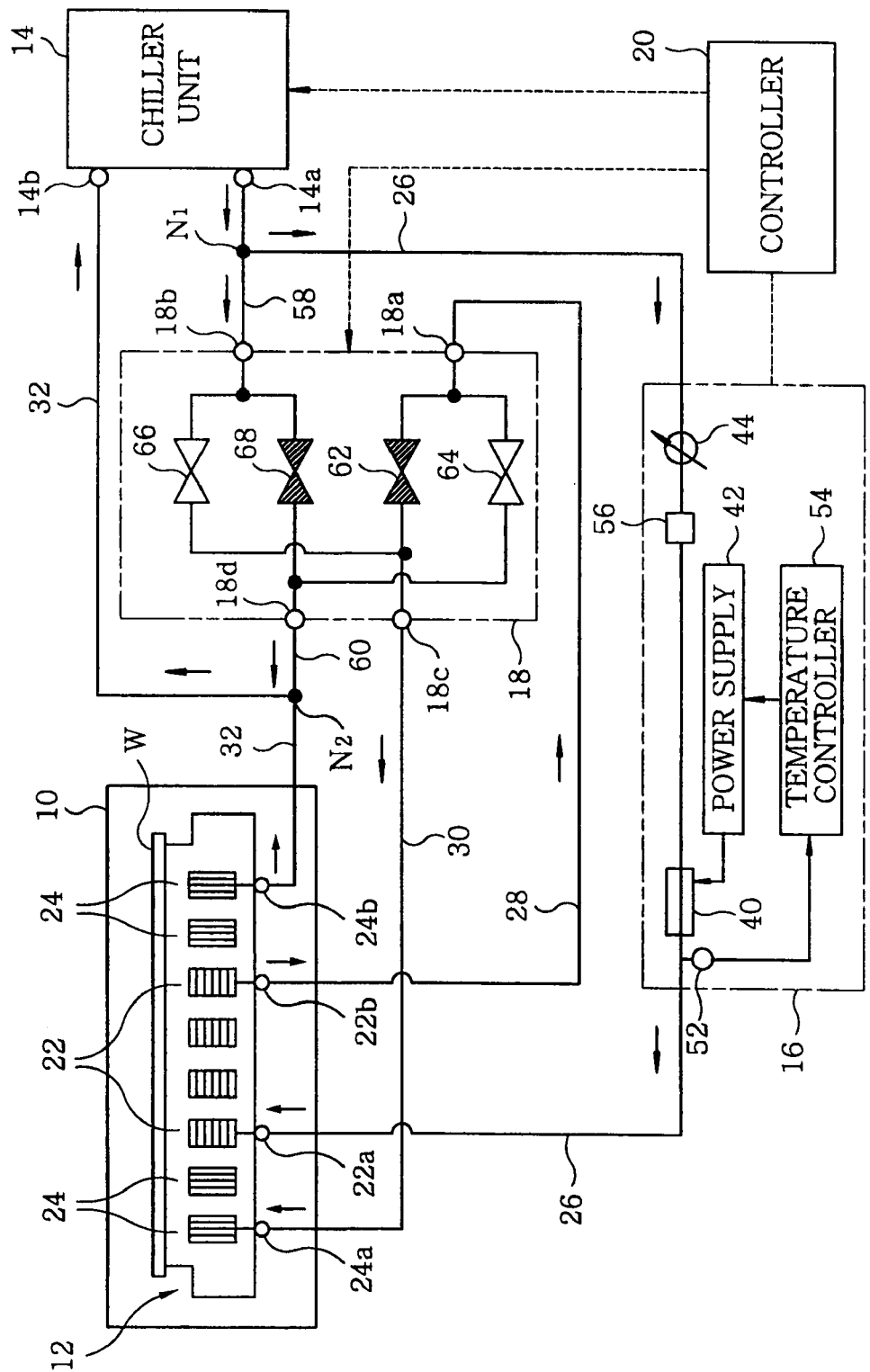
FIG. 1 is a block diagram showing a composition of a device for controlling a temperature of a mounting table in accordance with a first preferred embodiment of the present invention.

FIG. 1 shows a configuration of a temperature control device for a mounting table in accordance with a first embodiment of the present invention. In order to control a temperature and a temperature distribution of a substrate to be processed such as a semiconductor wafer W, inside a chamber 10 capable of being depressurized, typically, the temperature control device controls a temperature and a temperature distribution of a mounting table 12 for mounting thereon the semiconductor wafer W. Further, the temperature control device includes a coolant passageway provided in the mounting table 12, a chiller unit 14, a heating unit 16, a channel switching unit 18, lines 26, 28, 30, 32, 58, 60 and the like and a controller 20.

Provided inside the mounting table 12 is a multiple system, e.g., a dual system, of passageways where a coolant flows. Typically, coolant passageways 22 and 24 each having an inlet and an outlet are respectively provided in a central region and a peripheral region, wherein the central region and the peripheral region include a center and an edge of the mounting table 12, respectively. Those coolant passageways 22 and 24 are formed in, for example, a concentric shape or a spiral shape, so that a temperature of the coolant can affect the entire region. The coolant passageway 22 of the central region preferably has an inlet 22a and an outlet 22b provided at a central portion and a peripheral portion of the spiral passageway, respectively.

The inlet 22a of the coolant passageway 22 is connected to an output port 14a of the chiller unit 14 via the line 26, and the outlet 22b of the coolant passageway 22 is connected to a port (first inlet) 18a of the channel switching unit 18 via the line 28. Meanwhile, an inlet 24a of the coolant passageway 24 is connected to a port (first outlet) 18c of the channel switching unit 18 via the line 30, and an outlet 24b of the coolant passageway 24 is connected to a return port 14b of the chiller unit 14 via the line 32.

Figure 5:
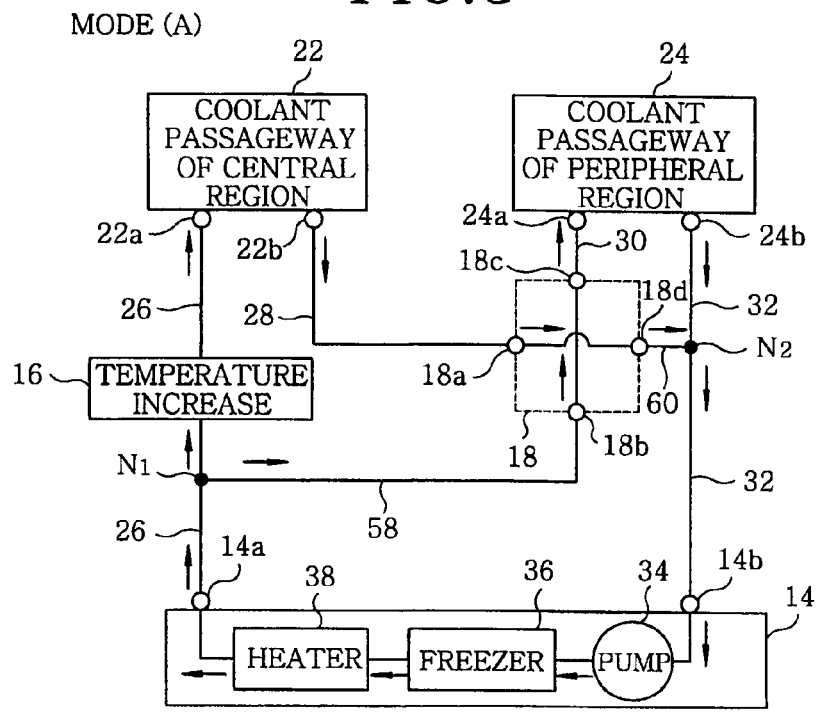
FIG. 5 schematically illustrates an entire channel system in the temperature control mode (A)

The chiller unit 14 supplies a coolant into the coolant passageways 22 and 24 of the mounting table 12 to be circulated therein. Further, for instance, as shown in FIG. 5, the chiller unit 14 includes a pump 34 for circulating a coolant, a freezer 36 for freezing the coolant that has just returned to the return port 14b and a heater 38 for heating the frozen coolant up to a predetermined base temperature (reference temperature). In general, since the chiller unit 14 is installed far from the mounting table 12, the lines 26 and 32 for connecting the chiller unit 14 and the mounting table 12 are considerably long (longer than, e.g., 5 m). Further, the controller 20 controls an operation of each component in the chiller unit 14 and the overall operation of the chiller unit 14 for circulating the coolant.

A base temperature of the coolant supplied from a coolant circulator is not a strictly constant and is not maintained at a single value. The base temperature thereof fluctuates around a predetermined value with a tolerance (e.g., 5° C.).

The heating unit 16 is installed in the middle of the line 26 to raise a temperature of the coolant from the base temperature to a desired temperature by heating the coolant. Further, the heating unit 16 includes an inline heater 40 attached to the line 26 near the mounting table 12 and a power supply 42 for supplying a power to the inline heater 40. It is preferable that the inline heater 40 can raise its temperature at a high speed and further has a physical strength capable of withstanding against a pressure of the coolant transferred from the chiller unit 14 via the long line 26, the coolant being transferred by pressure over a long distance. For example, an induction heating type heater illustrated in FIG. 2 may be employed as the inline heater 40.

Figure 2:
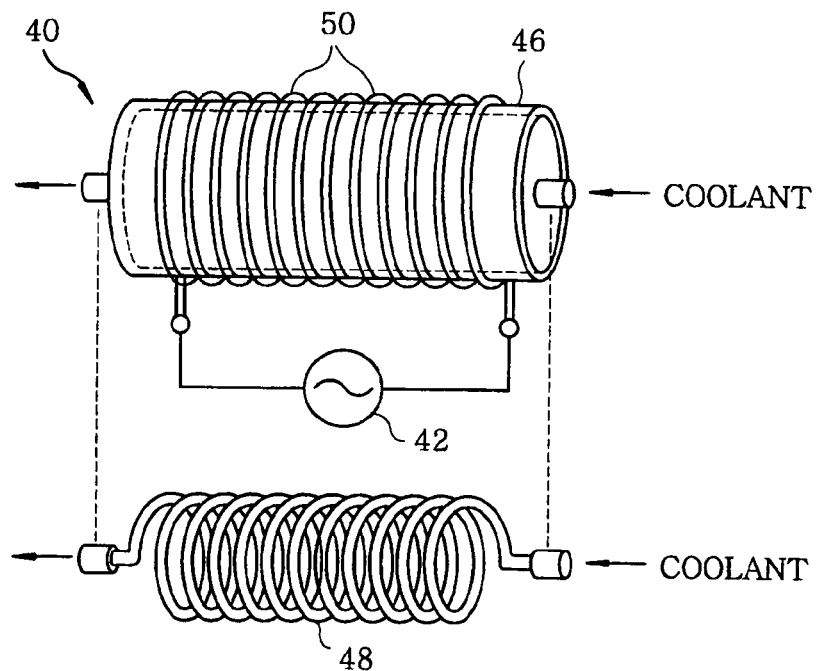
FIG. 2 describes a perspective view of an exemplary inline heater in a heating unit of the device for controlling a temperature of a mounting table.

Referring to FIG. 2, there is illustrated the inline heater 40 having an insulating cylinder 46 for accommodating therein a coil-shaped SUS heating element line 48 forming a part of the line 26. Further, a work coil 50 formed of a conducting wire is attached around the insulating cylinder 46 by insertion fitting. Once a high frequency power AC is supplied to the work coil 50 from a power supply 42, alternating magnetic flux is produced inside the insulating cylinder 46. Accordingly, an induction voltage is generated in the SUS heating element line 48 to have an induction current to flow therein, whereby the SUS heating element line 48 releases Joule heat. By heat generation in the SUS heating element line 48, a coolant flowing in the line is heated. Unlike a glass line of a heating lamp or the like, the SUS heating element line 48 has a considerable physical strength capable of withstanding against a pressure of a medium.

In this embodiment, in order to further accurately increase the temperature of the coolant, as shown in FIG. 1, the heating unit 16 has a temperature sensor 52 for detecting the coolant's temperature at a downstream side of the inline heater 40 and a temperature controller 54 for controlling power supplied from the power supply 42, i.e., a heat discharge rate of the heater 40 based on an output signal (temperature detecting signal) from the temperature sensor 52 so that the coolant's temperature becomes equal to a set value.

Moreover, in order to enhance the high-speed heating, there is provided a flow rate control valve 44 formed of a variable throttle valve which is operated manually or mechanically (e.g., a solenoid-operated valve, a motor-operated valve, an air-operated valve or the like) for variably controlling a flow rate of the coolant supplied into the coolant passageway 22 provided in the central region of the mounting table via the line 26. Besides, in order to improve accuracy in controlling a flow rate, a flow rate measuring device or a flow sensor 56 is attached to the line 26.

Figure 3:
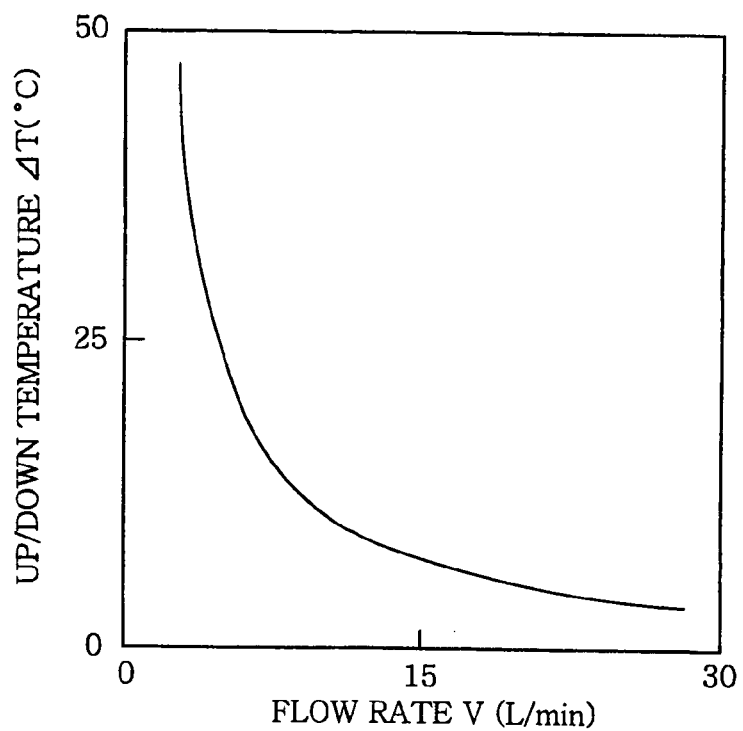
FIG. 3 provides a graph depicting characteristics of raising/lowering of the coolant temperature in the heating unit.

FIG. 3 shows a relationship between a flow rate and an up/down temperature for a case where a heat discharge rate of the inline heater 40 in the heating unit 16 being kept constant. As shown in FIG. 3, the flow rate is qualitatively inversely proportional to the up/down temperature, so that the coolant temperature can be greatly increased by reducing the flow rate. Therefore, the heating can be controlled by the inline heater 40 while the flow rate of the coolant being controlled by the flow rate control valve 44, whereby the coolant's temperature can be precisely and rapidly raised or lowered from the base temperature to a desired set temperature. Further, since the inline heater 40 is disposed near the mounting table 12, the rapid increase or decrease in the coolant's temperature can be transferred to the mounting table 12 with very small time constant. Accordingly, a temperature of each unit of the mounting table 12 can be rapidly raised or lowered to a desired set temperature. The controller 20 controls an operation of each component in the heating unit 16 and the overall operation of the heating unit 16 for raising or lowering the coolant's temperature.

Referring to FIG. 1, the flow rate switching unit 18 has two ports (second inlet and second outlet) 18b and 18d as well as the aforementioned two ports (first inlet and first outlet) 18a and 18c. Here, the second inlet 18b is connected to a branch-point $N_1$ provided at an upstream side of the heating unit 16 of the line 26 via the line 58, while the second outlet 18d is connected to a branchpoint $N_2$ provided in the line 32 via the line 60.

The flow rate switching unit 18 has therein a plurality of, e.g., four, valves 62, 64, 66 and 68. To be specific, a first opening/closing valve 62 is provided between the first inlet 18a and the first outlet 18c; a second opening/closing valve 64 is provided between the first inlet 18a and the second outlet 18d; a third opening/closing valve 66 is provided between the second inlet 18b and the first outlet 18c; and a fourth opening/closing valve 68 is provided between the second inlet 18b and the second outlet 18d. Although the flow rate switching unit 18 can be installed at any location, it is preferable that at least the opening/closing valve 62 for selectively connecting the outlet 22b of the coolant passageway 22 and the inlet 24a of the coolant passageway 24 is provided near the mounting table 12.

The opening/closing valves 62, 64, 66 and 68 may be turned on/off in a complementary relationship. For example, it is possible to configure the second and the third opening/closing valves 64 and 66 as normal open valves and the first and the fourth opening/closing valves 62 and 68 as normal close valves. However, in order to increase types of channel switching modes, it is preferable to provide a configuration in which the opening/closing valves 62, 64, 66 and 68 are independently turned on/off. The controller 20 controls an operation of each component (on/off operations of the opening/closing valves 62 to 68) in the channel switching unit 18 and the overall operation of the channel switching unit 18 for switching channels.

The controller 20 is formed of a computer system including a CPU, a memory and the like and controls an operation of each unit, especially the chiller unit 14, the heating unit 16 and the channel switching unit 18, in the device for controlling a temperature of a substrate, and its overall operation (sequence). A configuration of a main controller 140 will be described later with reference to FIG. 24.

Hereinafter, there will be described a temperature control function of the device for controlling a temperature of a mounting table in accordance with this embodiment. In the temperature control device for a mounting table, six modes (A), (B), (C), (D), (E) and (F) for controlling a temperature of the mounting table 12 can be obtained by combining an ON/OFF state of the heating operation in the heating unit 16 with ON/OFF states of the opening/closing valves 62, 64, 66 and 68 in the channel switching unit 18 under the control of the controller 20.

Figure 4:
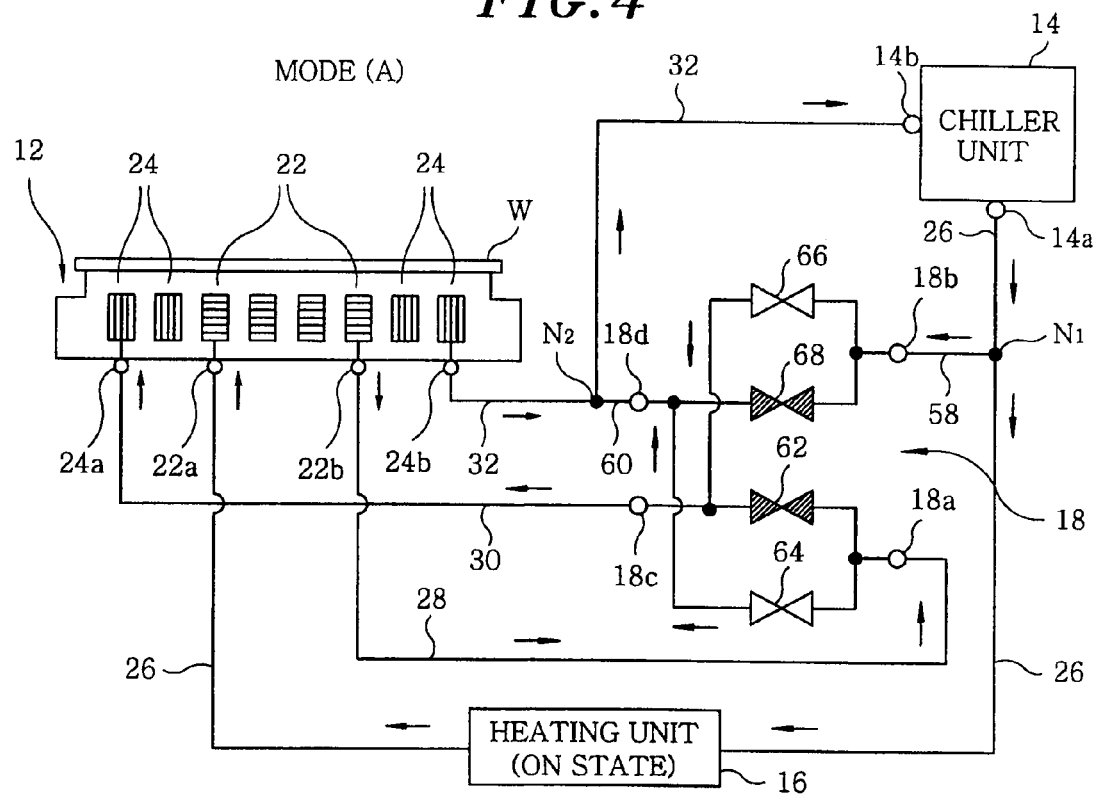
FIG. 4 represents each unit's state for implementing a temperature control mode (A) in the device for controlling a temperature of a mounting table.

As shown in FIG. 4, in the mode (A), the heating operation of the heating unit 16 is turned on. At the same time, in the channel switching unit 18, the opening/closing valves 64 and 66 are turned on, whereas the opening/closing valves 62 and 68 are turned off. Due to the channel switching in the channel switching unit 18, as illustrated in FIG. 5, the coolant passageway 22 of the central region and the coolant passageway 24 of the peripheral region are connected in parallel between the output port 14a and the return port 14b of the chiller unit 14.

In other words, a part of the coolant of a base temperature outputted from the chiller unit 14, i.e., the coolant flowing directly in the line 26 after passing through the branchpoint $N_1$, has its temperature to be raised from the base temperature to a desired set temperature in the heating unit 16 to enter the coolant passageway 22. Next, the coolant coming out of the coolant passageway 22 enters the channel switching unit 18 via the line 28; flows into the line 60 via the opening/closing valve 64 being turned on; passes through the branchpoint $N_2$; and returns to the chiller unit 14 via the line 32 without entering the coolant passageway 24. Further, the coolant branched from the branchpoint $N_1$ toward the line 58 enters the coolant passageway 24 of the peripheral region via the channel switching unit 18 (the opening/closing valve 66 being turned on) and the line 30, while maintaining the base temperature. Then, the coolant coming out of the coolant passageway 24 directly returns to the chiller unit 14 via the line 32.

In accordance with the mode (A), a temperature of the peripheral region of the mounting table 12 is controlled by the coolant of the base temperature and, also, that of the central region of the mounting table 12 is controlled by the coolant of a set temperature higher than the base temperature. Accordingly, it is possible to obtain a mountain-shaped or trapezoid-shaped temperature distribution, in which the temperature of the central region is comparatively higher than that of the peripheral region in the mounting table 12, and arbitrarily control a temperature difference therebetween. Furthermore, such temperature distribution can be obtained in a short time period by using the function of the heating unit 16 capable of raising the temperature at high speed.

Figure 6:
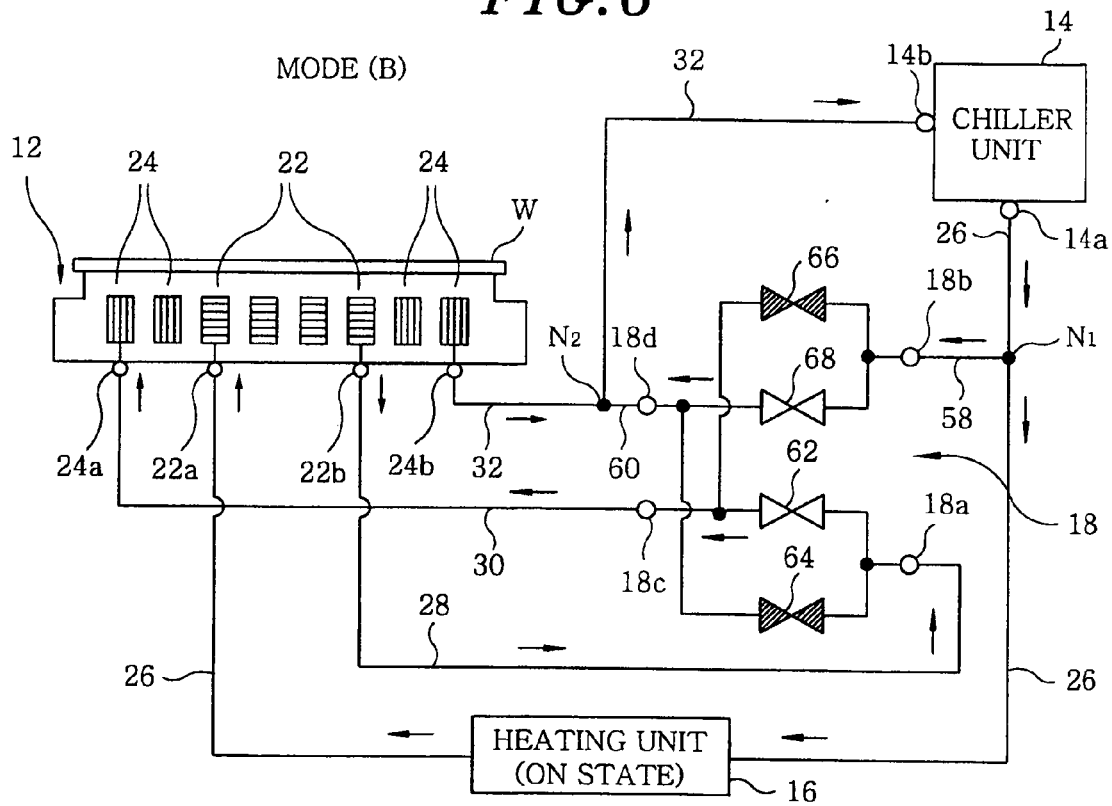
FIG. 6 presents each unit's state for implementing a temperature control mode (B) in the device for controlling a temperature of a mounting table.
Figure 7:
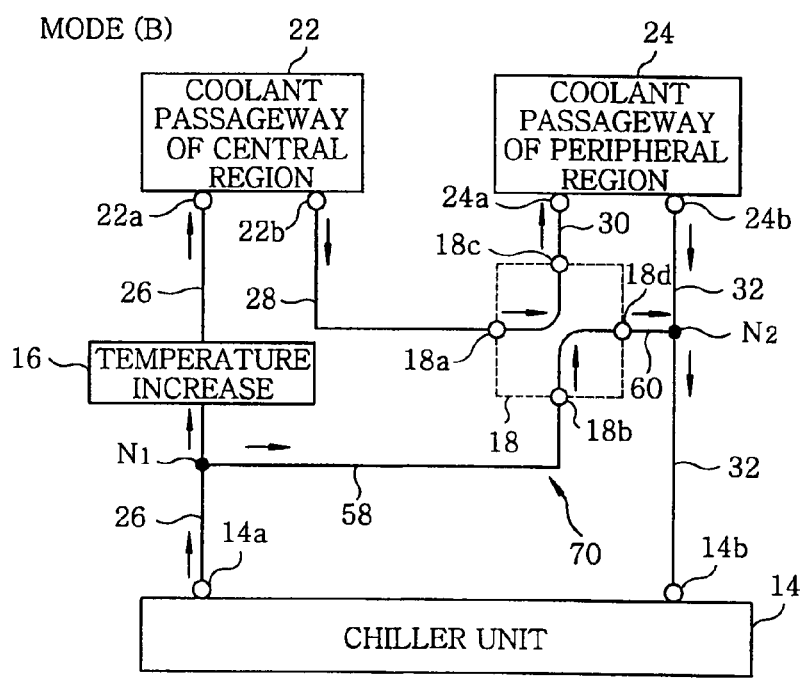
FIG. 7 schematically shows an entire channel system in the temperature control mode (B)

As shown in FIG. 6, in the mode (B), the heating operation of the heating unit 16 is turned on. At the same time, in the channel switching unit 18, the opening/closing valves 62 and 68 are turned on, whereas the opening/closing valves 64 and 66 are turned off. Due to the channel switching in the channel switching unit 18, as illustrated in FIG. 7, the coolant passageway 22 of the central region and the coolant passageway 24 of the peripheral region are connected in series between the output port 14a and the return port 14b of the chiller unit 14. Moreover, there is provided a bypass channel formed of the line 58, the channel switching unit 18 and the line 60.

To be specific, a part of the coolant of a base temperature outputted from the chiller unit 14, i.e., the coolant flowing directly into the line 26 through the branchpoint $N_1$, has its temperature to be raised from the base temperature to a desired set temperature in the heating unit 16 to thereafter enter the coolant passageway 22. Next, the coolant coming out of the coolant passageway 22 enters the coolant passageway 24 via the line 28, the channel switching unit 18 and the line 30. Thereafter, the coolant coming out of the coolant passage 24 directly returns to the chiller unit 14 via the line 32. Meanwhile, a coolant branched from the branchpoint $N_1$ toward the line 58 passes through the channel switching unit 18 (the opening/closing valve 68 being turned on) and the line 60 while maintaining the base temperature; flows into the line 32 from the branchpoint $N_2$; and returns to the chiller unit 14 with the coolant coming out of the coolant passageway 24.

In accordance with the mode (B), by controlling temperatures of the central region and the peripheral region of the mounting table 12 with a coolant having a temperature higher than the base temperature, a temperature of the entire mounting table 12 can be controlled at a desired set temperature higher than the base temperature in an approximately uniform or flat temperature distribution and further can be rapidly raised by the heating unit 16. In this case, even if a flow rate of the coolant is arbitrarily reduced by the flow rate control valve 44 in the heating unit 16, since a residual coolant flows in the bypass channel 70, the heating unit 16 can immediately and stably raise the temperature to a desired level while uniformly maintaining a coolant circulating efficiency (coolant output pressure) of the chiller unit 14.

Figure 8:
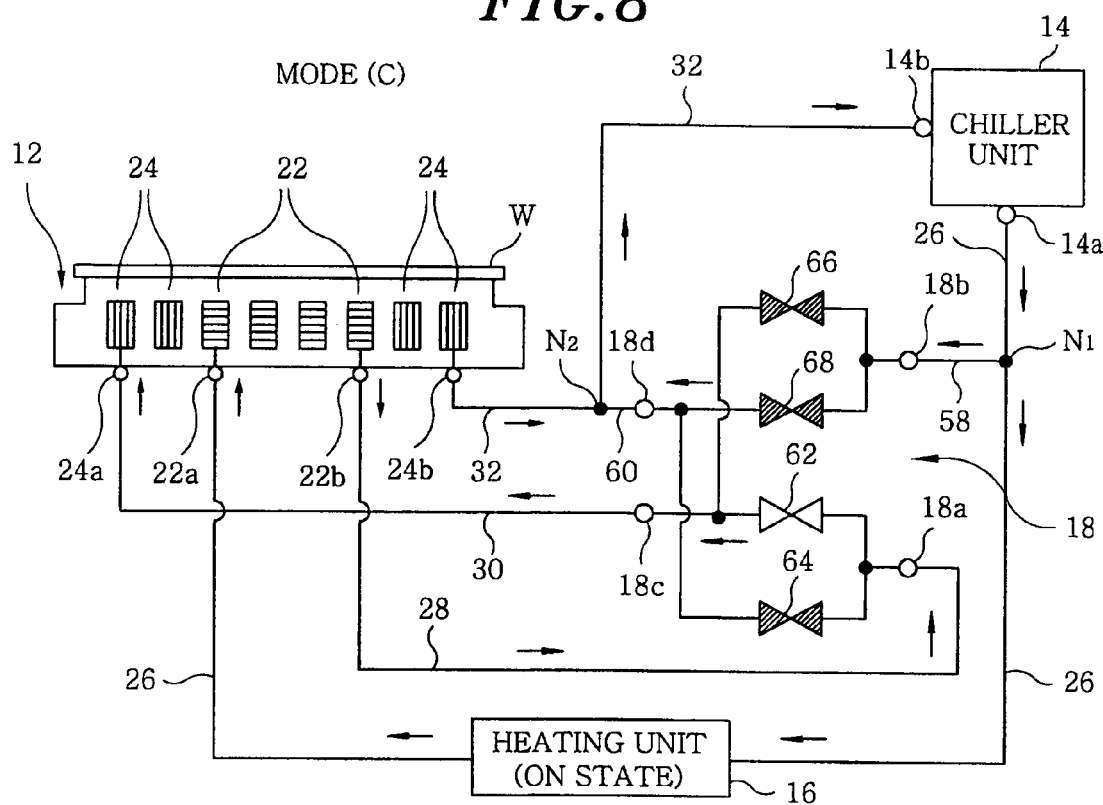
FIG. 8 describes each unit's state for implementing a temperature control mode (C) in the device for controlling a temperature of a mounting table.
Figure 9:
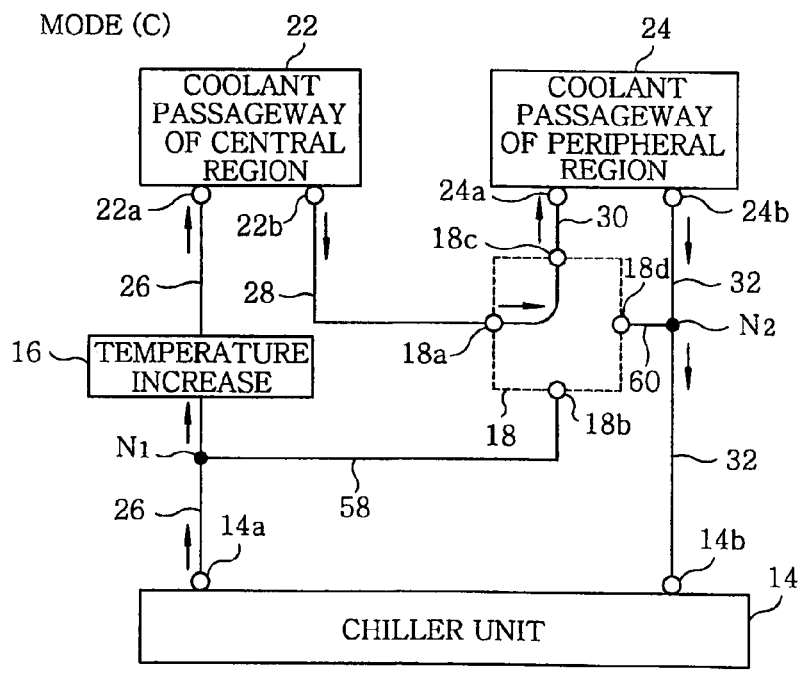
FIG. 9 schematically depicts an entire channel system in the temperature control mode (C)

A coolant supply in the mode (C) is performed in a same manner as that in the mode (B) except that the bypass channel 70 is not formed. In other words, as shown in FIG. 8, the heating operation of the heating unit 16 is turned on. At the same time, in the channel switching unit 18, the opening/ closing valve 62 is exclusively turned on, whereas the other opening/closing valves 64, 66 and 68 are turned off. Due to the channel switching in the channel switching unit 18, as illustrated in FIG. 9, the coolant passageway 22 of the central region and the coolant passageway 24 of the peripheral region are connected in series between the output port 14*a* and the return port 14*b* of the chiller unit 14. However, the bypass channel 70 is not formed due to an isolation of the channel between the line 58 and the line 60 (in the channel switching unit 18).

In this case, the entire coolant of a base temperature outputted from the chiller unit 14 flows directly into the line 26 through the branchpoint $N_1$. The coolant has its temperature to be raised from the base temperature to a desired set temperature in the heating unit 16 and then enters the coolant passageway 22. Next, the coolant coming out of the coolant passageway 22 enters the coolant passage 24 via the line 28, the channel switching unit 18 (the opening/closing valve 62 being turned on) and the line 30. Thereafter, the coolant coming out of the coolant passage 24 directly returns to the chiller unit 14 via the line 32.

In the mode (C), the temperature increase may not be as rapid and effective as in the mode (B). However, the entire mounting table 12 can be controlled to be at a desired set temperature higher than the base temperature in an approximately flat (uniform) temperature distribution.

Figure 10:
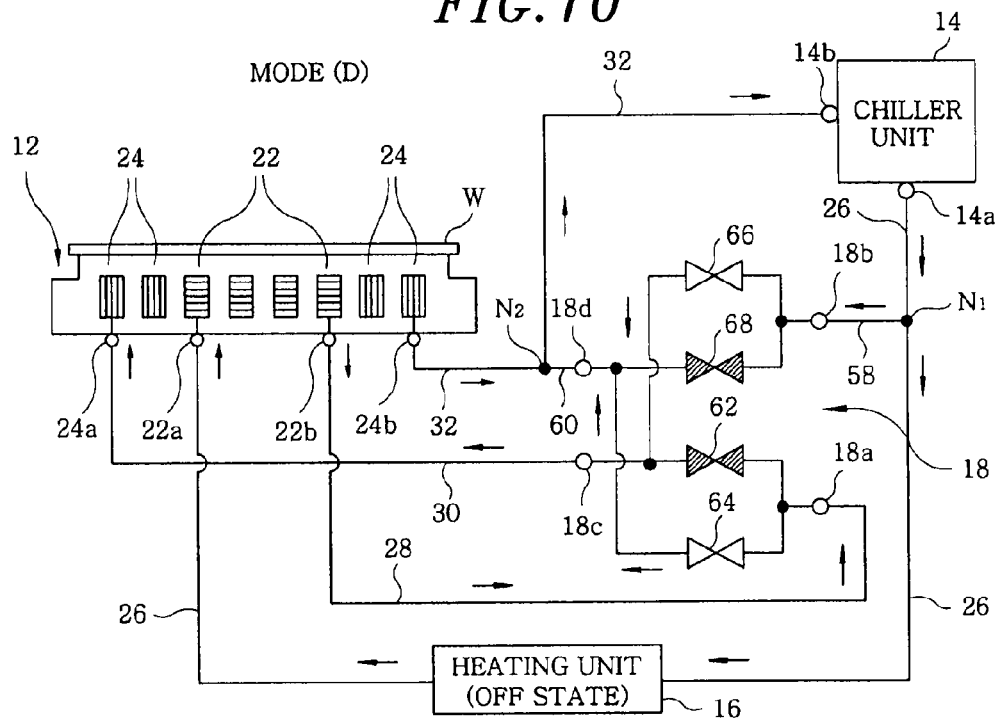
FIG. 10 represents each unit's state for implementing a temperature control mode (D) in the device for controlling a temperature of a mounting table.
Figure 11:
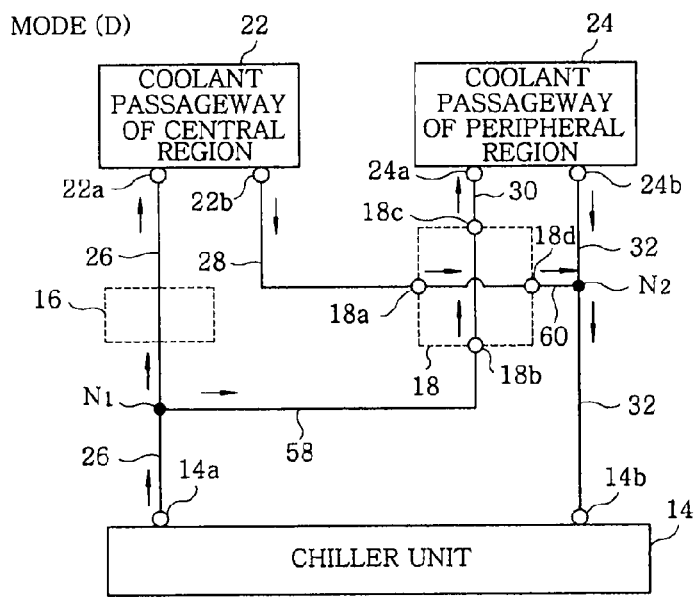
FIG. 11 schematically illustrates an entire channel system in the temperature control mode (D)

In the mode (D), a channel state in the channel switching unit 18 becomes same as that in the mode (A) by stopping the heating operation of the heating unit 16 (OFF state). That is, as illustrated in FIG. 10, the opening/closing valves 64 and 66 are turned on, whereas the opening/closing valves 62 and 68 are turned off. Accordingly, as depicted in FIG. 11, the coolant passageway 22 of the central region and the coolant passageway 24 of the peripheral region are connected in parallel between the output port 14*a* and the return port 14*b* of the chiller unit 14.

Therefore, a part of the coolant of a base temperature outputted from the chiller unit 14, i.e., the coolant flowing directly into the line 26 through the branchpoint $N_1$, enters the coolant passageway 22 while maintaining the base temperature without being heated by the heating unit 16. Next, the coolant coming out of the coolant passageway 22 enters the channel switching unit 18 via the line 28 and then flows toward the line 60 via the opening/closing valve 64 that is being turned on. Thereafter, the coolant returns to the chiller unit 14 through the branchpoint $N_2$ via the line 32 without entering the coolant passageway 24. Further, a coolant branched from the branchpoint $N_1$ toward the line 58 enters the coolant passageway 24 of the peripheral region via the channel switching unit 18 (the opening/closing valve 66 being turned on) and the line 30 while maintaining the base temperature. Then, the coolant coming out of the coolant passageway 24 directly returns to the chiller unit 14 via the line 32.

In accordance with the mode (D), by controlling respective temperatures of the central region and the peripheral region of the mounting table 12 with a coolant of the base temperature, a temperature of the entire mounting table 12 can be controlled to be at a temperature close to the base temperature in an approximately uniform or flat temperature distribution. Here, shifting from the mode (A) to the mode (D) can be rapidly performed only by changing a state of the heating unit 16 from an ON state to an OFF state. In other words, by stopping the rapid increase of temperature by the heating unit 16, the temperature can be rapidly lowered from the set temperature to the base temperature. Shifting from the mode (B) or (C) to the mode (D) can also be rapidly executed although switching operations are required in the channel switching unit 18.

Figure 12:
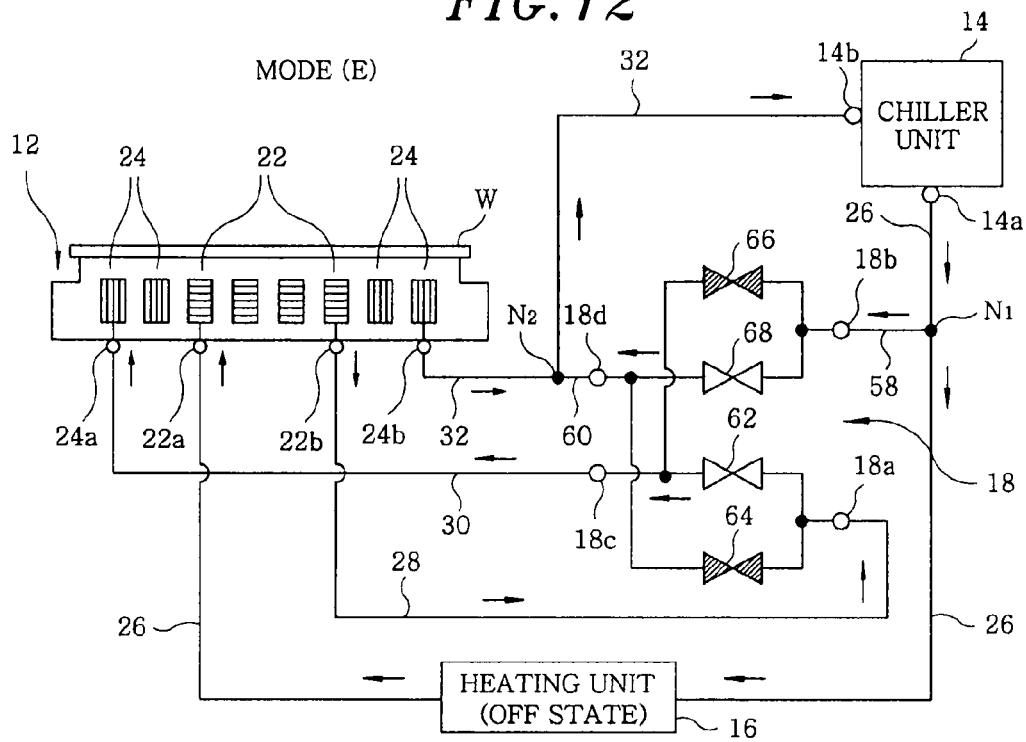
FIG. 12 presents each unit's state for implementing a temperature control mode (E) in the device for controlling a temperature of a mounting table.
Figure 13:
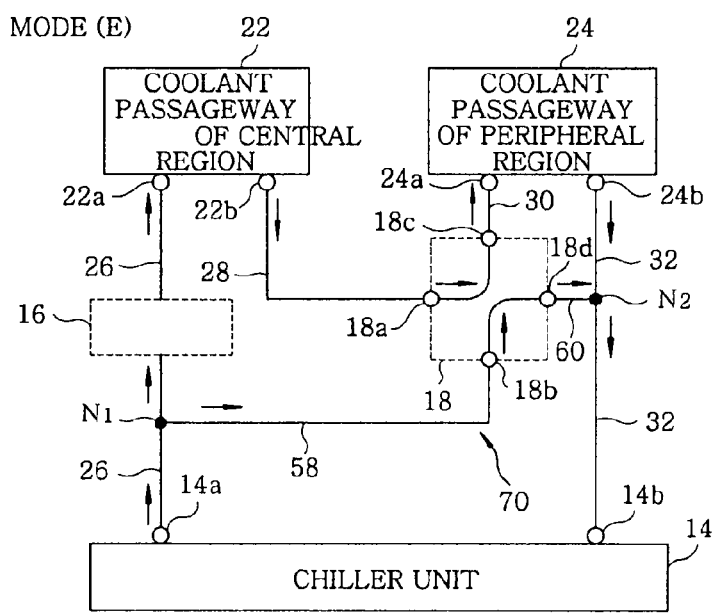
FIG. 13 schematically describes an entire channel system in the temperature control mode (E)

In the mode (E), a channel state in the channel switching unit 18 is made same as that in the mode (B) while stopping the heating operation of the heating unit 16 (OFF state). That is, as illustrated in FIG. 12, the opening/closing valves 62 and 68 are turned on, whereas the opening/closing valves 64 and 66 are turned off. Accordingly, as depicted in FIG. 13, the coolant passageway 22 of the central region and the coolant passageway 24 of the peripheral region are connected in series between the output port 14*a* and the return port 14*b* of the chiller unit 14. Further, there is also provided the bypass channel 70 formed of the line 58, the channel switching unit 18 and the line 60.

In this case, a part of the coolant of a base temperature outputted from the chiller unit 14, i.e., the coolant flowing directly into the line 26 through the branchpoint $N_1$ enters the coolant passageway 22 without being heated by the heating unit 16. Next, the coolant coming out of the coolant passageway 22 enters the coolant passage 24 via the line 28, the channel switching unit 18 (the opening/closing valve 62 being turned on) and the line 30. Thereafter, the coolant coming out of the coolant passage 24 returns to the chiller unit 14 via the line 32. Meanwhile, a coolant branched from the branchpoint $N_1$ toward the line 58 passes through the channel switching unit 18 (the opening/closing valve 68 being turned on) and the line 60 while maintaining the base temperature; flows into the line 32 through the branchpoint $N_2$; and directly returns to the chiller unit 14 with the coolant coming out of the coolant passageway 24.

Also in the mode (E), by controlling respective temperatures of the central region and the peripheral region of the mounting table 12 with a coolant of the base temperature, a temperature of the entire mounting table 12 can be controlled to be at a temperature close to the base temperature in an approximately flat temperature distribution. Furthermore, shifting from the mode (A), (B) or (C) to the mode (E) can be executed simply and rapidly.

However, to be strict, the temperature distribution on the mounting table 12 in the mode (E) and that in the mode (D) are subtly different from each other. In other words, in the mode (D), the coolant of the base temperature outputted from the chiller unit 14 is divided into two at the branchpoint $N_1$ of the line 26 to be supplied in parallel to the coolant passageway 22 for the central region and the coolant passageway 24 for the peripheral region of the mounting table 12, respectively. Accordingly, the temperatures of the central region and the peripheral region of the mounting table 12 are controlled by the coolants having approximately the same temperature, thereby enhancing the flatness (uniformity) of the temperature distribution over the entire mounting table 12. On the other hand, in the mode (E), the entire coolant of the base temperature outputted from the chiller unit 14 flows in the coolant passageway 22 of the central region of the mounting table 12 first and then flows in the coolant passageway 24 of the peripheral region of the mounting table 12. Accordingly, the latter (peripheral region) has a slightly poorer cooling efficiency than the former (central region). Therefore, the temperature distribution of the entire mounting table 12 is not precisely flat, and the temperature in the peripheral region tends to be slightly higher than that in the central region.

Figure 14:
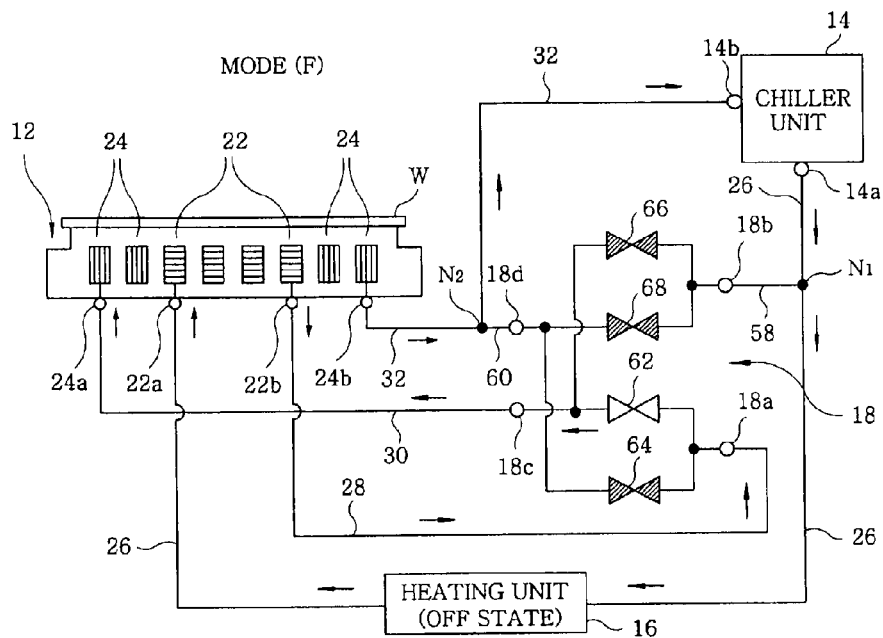
FIG. 14 shows each unit's state for implementing a temperature control mode (F) in the device for controlling a temperature of a mounting table.
Figure 15:
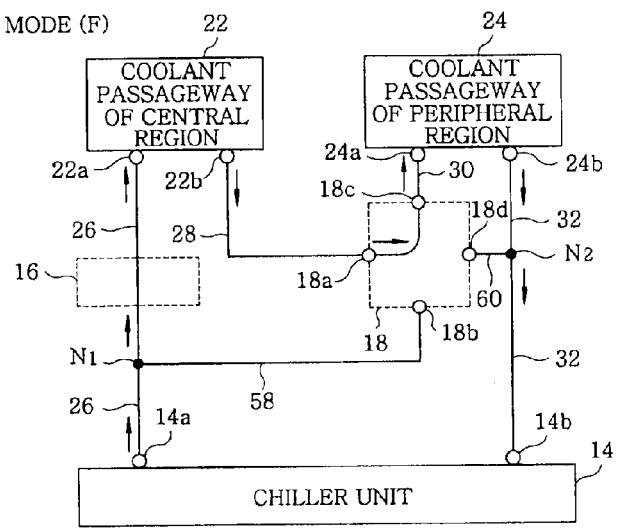
FIG. 15 schematically presents an entire channel system in the temperature control mode (F)

Finally, in the mode (F), a channel state in the channel switching unit 18 is made same as that in the mode (C) while stopping the heating operation of the heating unit 16 (OFF state). That is, as illustrated in FIG. 14, the opening/closing valve 62 is exclusively turned on, whereas the other opening/ closing valves 64, 66 and 68 are turned off. Accordingly, as depicted in FIG. 15, the coolant passageway 22 of the central region and the coolant passageway 24 of the peripheral region are connected in series between the output port 14a and the return port 14b of the chiller unit 14. However, the bypass channel 70 is not formed due to an isolation of the channel between the line 58 and the line 60 (in the channel switching unit 18).

In this case, the entire coolant of a base temperature outputted from the chiller unit 14 flows straight into the line 26 through the branchpoint $N_1$ to thereafter enter the coolant passageway 22 without being heated by the heating unit 16. Next, the coolant coming out of the coolant passageway 22 enters the coolant passage 24 via the line 28, the channel switching unit 18 (the opening/closing valve 62 being turned on) and the line 30. Thereafter, the coolant coming out of the coolant passage 24 directly returns to the chiller unit 14 via the line 32.

Also in the mode (F), by controlling temperatures of the central region and the peripheral region of the mounting table 12 with a coolant of the base temperature, the temperature of the entire mounting table 12 can be controlled at a temperature close to the base temperature in an approximately flat temperature distribution. Further, shifting from the mode (A), (B) or (C) to the mode (F) can be executed simply and rapidly.

However, to be strict, the mode (F) is different from the modes (D) and (E). The difference between the mode (F) and the mode (D) is the same as the aforementioned difference between the mode (E) and the mode (D). Further, compared with the mode (E), in the mode (F), the entire coolant outputted from the chiller unit 14 can flow in the coolant passageways 22 and 24 of the mounting table 12 due to the absence of the bypass channel 70 and, thus, the temperature control function of the chiller unit 14 can be more perfectly achieved.

As described above, the temperature control device for a mounting table in accordance with this embodiment includes the single chiller unit 14; the heating unit 16 using the inline heater 40; the channel switching unit 18 having four opening/closing valves 62, 64, 66 and 68; and the controller 20 for controlling operations or states of the respective units 14, 16 and 18. By using the temperature control device configured simply at a low cost, the temperature and the temperature distribution of the mounting table 12 can be controlled with high accuracy, thereby obtaining various set values or profiles by rapidly raising or lowering the temperature.

[Embodiment 2]

Figure 16:
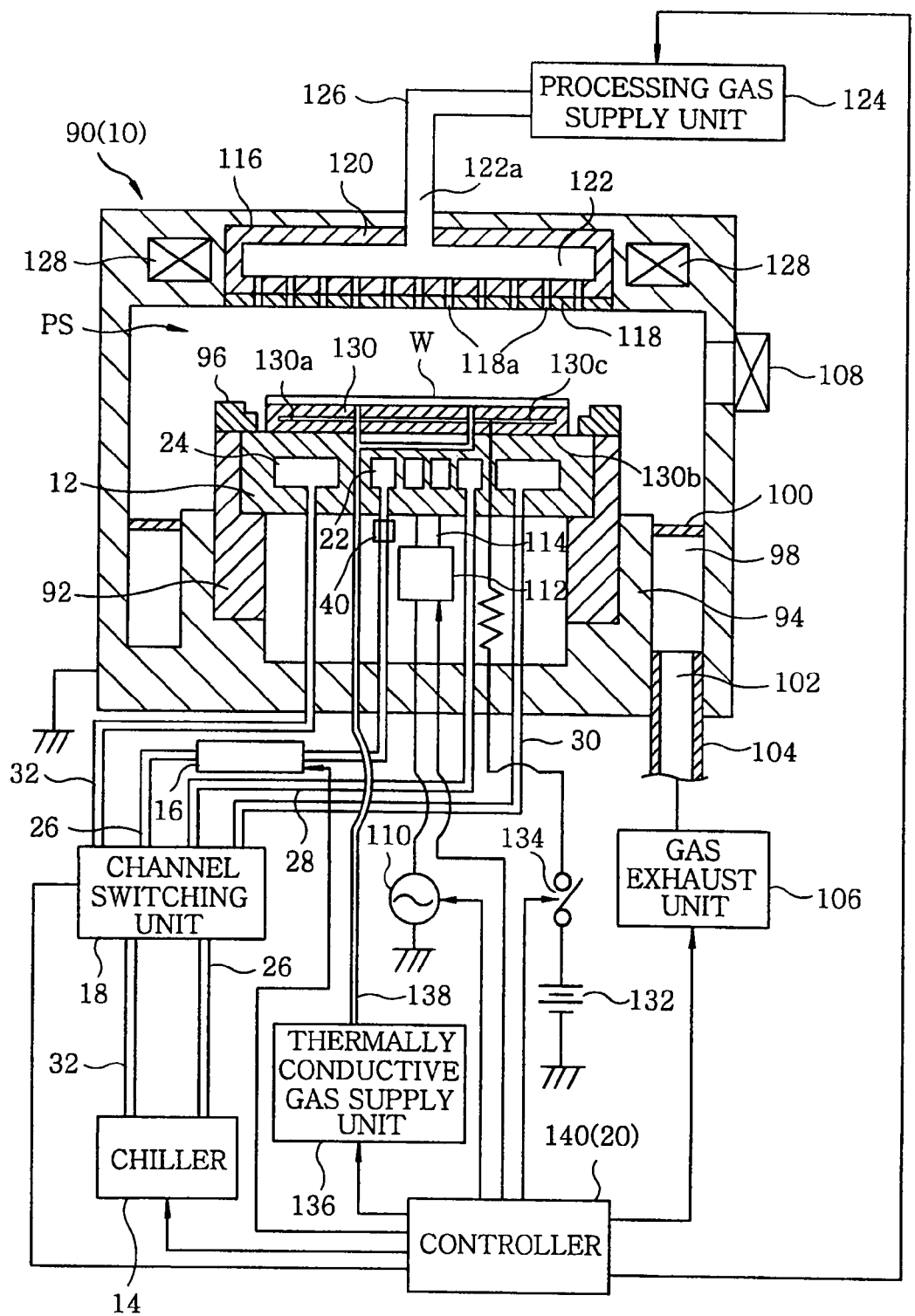
FIG. 16 is a cross sectional view illustrating a composition of a plasma etching apparatus in accordance with a second preferred embodiment of the present invention.

FIG. 16 illustrates a configuration of a plasma processing apparatus in accordance with a second preferred embodiment of the present invention. The plasma processing apparatus has therein the temperature control device for a mounting table in accordance with the first embodiment of the present invention.

As shown in FIG. 16, the plasma processing apparatus is configured as a parallel plate plasma etching apparatus and has a cylindrical chamber (processing chamber) 90 whose inner wall surface is made of stainless steel or aluminum coated with an alumite treated alumina film, an yttrium oxide film ($Y_2O_3$), ceramic or quartz or the like. The chamber 90 corresponds to the chamber 10 of FIG. 1. Further, the chamber 90 is frame grounded.

The mounting table 12 of a circular plate shape for mounting thereon a substrate to be processed, e.g., a semiconductor wafer W is disposed in the chamber 90 and serves as a lower electrode or a susceptor. The mounting table 12 made of, e.g., aluminum is supported by a cylindrical supporting portion 94 vertically extended from a bottom of the chamber 90 via an insulating cylindrical maintaining portion 92. A ring-shaped focus ring 96 formed of, e.g., quartz is disposed on a top surface of the cylindrical maintaining portion 92 to surround a top surface of the mounting table 12.

A gas exhaust path 98 is formed between a sidewall of the chamber 90 and the cylindrical supporting portion 94. Further, an evacuation plate 100 is provided at the entrance of the gas exhaust path 98 or in the middle thereof. Furthermore, a gas exhaust port 102 is provided at a bottom portion of the gas exhaust path 98. Moreover, a gas exhaust unit 106 is connected to the gas exhaust port 102 via a gas exhaust line 104. The gas exhaust unit 106 has a vacuum pump and is able to depressurize a processing space inside the chamber 90 to a predetermined vacuum level. Attached to the sidewall of the chamber 90 is a gate valve 108 for opening or closing a loading/unloading port of the semiconductor wafer W.

A high frequency power supply 110 for generating a plasma is electrically connected to the mounting table 12 via a matching unit 112 and a power feed rod 114. The high frequency power supply 110 applies a high frequency power (e.g., 60 MHz) higher than or equal to a desired value, e.g., 27 MHz, to the mounting table 12 serving as the lower electrode. A shower head 116 facing the mounting table 12 in parallel is provided at a ceiling portion of the chamber 90, the shower head 116 serving as an upper electrode of a ground potential. Moreover, a high frequency electric field is formed between the mounting table 12 and the shower head 116, i.e., in a plasma generation space PS, by the high frequency power applied from the high frequency power supply 110.

The shower head 116 includes an electrode plate 118 having a plurality of gas ventholes 118a and an electrode support member 120 for detachably supporting the electrode plate 118. Further, a buffer chamber 122 is provided inside the electrode support member 120, and a gas supply line 126 coupled to a processing gas supply unit 124 is connected to a gas inlet opening 122a of the buffer chamber 122.

A magnetic field forming mechanism 128 is provided in a ring shape or a concentric shape at an upper peripheral portion of the plasma generation space PS (preferably, around the shower head 116) in the ceiling portion of the chamber 90. The magnetic field forming mechanism 128 facilitates a high frequency discharge (plasma ignition) in the plasma generation space PS, thereby stably maintaining the discharge.

An electrostatic chuck 130 is disposed on a top surface of the mounting table 12 to hold the semiconductor wafer W by an electrostatic adsorptive force. The electrostatic chuck 130 has therein an electrode 130a made of a conductive film, which is inserted between a pair of insulating films 130b and 130c. A DC power supply 132 is electrically connected to the electrode 130a via a switch 134. The semiconductor wafer W can be adsorbed and supported on the chuck by Coulomb force generated by the DC voltage applied from the DC power supply 132.

In the same way as in the first embodiment, a first coolant passageway 22 and a second coolant passageway 24 formed in a ring shape or a spiral shape are provided in a central region and a peripheral region inside the mounting table 12, respectively. Further, a coolant of a predetermined temperature is supplied into the coolant passageways 22 and 24 by circulation from the temperature control device for a mounting table, wherein the device includes the chiller unit 14, the heating unit 16 and the channel switching unit 18 as in the first embodiment.

Moreover, a thermally conductive gas, e.g., He gas, is supplied from a thermally conductive gas supply unit 136 to a gap between a top surface of the electrostatic chuck 130 and a backside surface of the semiconductor wafer W via the gas supply line 138.

A controller 140 independently controls each unit in the plasma etching apparatus and also controls an entire sequence. That is, the controller 140 serves as the controller 20 (FIG. 1) of the temperature control device for a mounting table at the same time.

Although it is not illustrated, the plasma etching apparatus may have a configuration in which a high frequency power supply having a frequency of 27 MHz or higher, e.g., 60 MHz, is connected to the shower head 116 serving as an upper electrode and, further, a high frequency power supply having a frequency ranging from 2 MHz to 27 MHz, e.g., 2 MHz, is connected to the mounting table 12 serving as a lower electrode. In this case, preferably, a high pass filter HPF for transmitting the high frequency (60 MHz) from the shower head 116 to ground is electrically connected to the mounting table 12, and a low pass filter LPF for transmitting the high frequency (2 MHz) from the mounting table 12 to ground is electrically connected to the shower head 116.

In the plasma processing apparatus, in order to perform the etching, the semiconductor wafer W to be processed is loaded into the chamber 90 while opening the gate valve 108 and then mounted on the mounting table 12. Next, by applying a DC voltage from the DC power supply 132 to the electrode 130a of the electrostatic chuck 130, the semiconductor wafer W is held on the electrostatic chuck 130. Further, as will be described later, a temperature of the mounting table 12 is controlled, and a thermally conductive gas is supplied from the thermally conductive gas supply unit 136 to a gap between a top surface of the electrostatic chuck 130 and a backside surface of the semiconductor wafer W. Thereafter, an etching gas (generally, a gaseous mixture) is introduced into the chamber 90 at a predetermined flow rate and flow rate ratio from the processing gas supply unit 124, and a pressure inside the chamber 90 is set to be a predetermined level by using the gas exhaust unit 106. Then, a high frequency of specific power is supplied from the high frequency power supply 110 to the mounting table 12. The etching gas injected through the shower head 116 is discharged and converted into a plasma in the plasma generation space PS. Moreover, a main surface of the semiconductor wafer W is etched by radicals or ions generated from the plasma.

There will be now described examples related to a method for controlling etching characteristics with the use of a technique for controlling a temperature of a mounting table of this embodiment in the plasma etching process.

In the plasma processing apparatus, a temperature distribution of a substrate to be processed on the mounting table is affected by process types or apparatus structures. In general, a temperature of the substrate tends to be higher in the edge area than in the central area due to heat radiation from a plasma and a chamber wall, high density electrons and the like. As described above, in accordance with the present invention, the surface temperature of the semiconductor wafer W can be made uniform by applying the temperature control mode (A).

Figure 17:
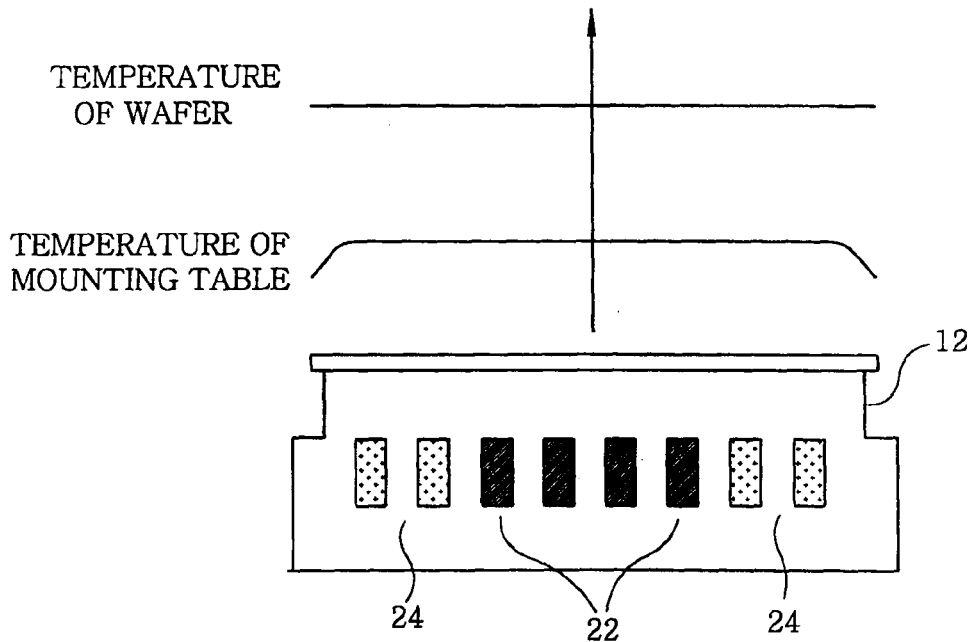
FIG. 17 depicts a temperature distribution of a mounting table and a semiconductor wafer in accordance with the second preferred embodiment of the present invention.
Figure 18:
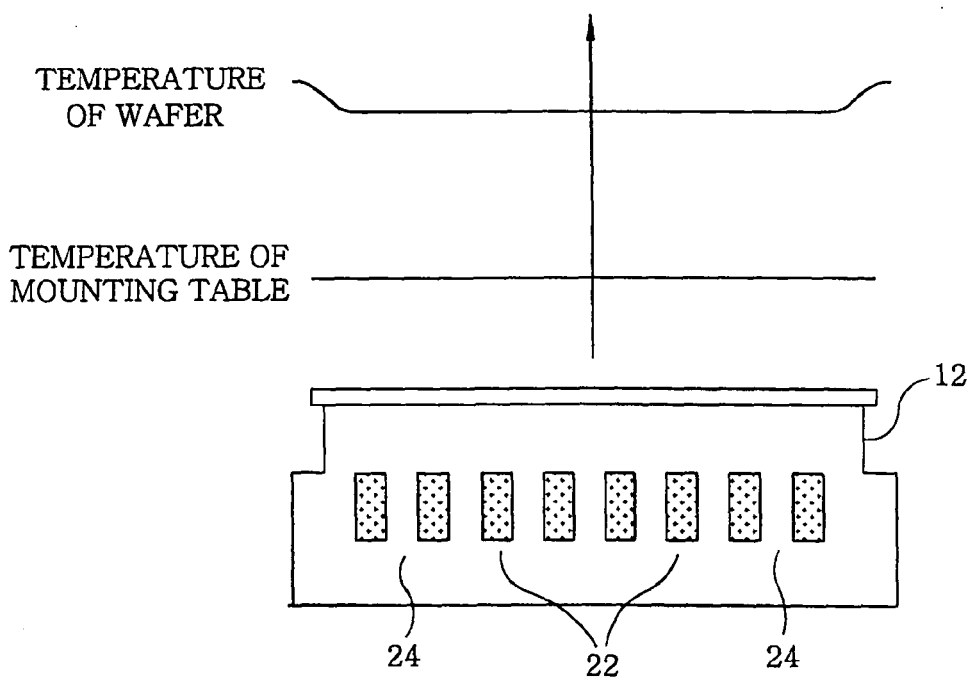
FIG. 18 describes a temperature distribution of a mounting table and a semiconductor wafer in accordance with a reference example.

In other words, as described above, by selecting the mode (A) (see FIGS. 4 and 5) in controlling the temperature of the mounting table 12, it is possible to make a temperature of an inner portion (the central region) higher than that of the peripheral region in the mounting table 12. Accordingly, as shown in FIG. 17, it was possible to obtain an approximately uniform (flat) temperature distribution in the central region and the peripheral region of the semiconductor wafer W on the mounting table 12. In contrast, by flowing the coolants having an approximately same temperature in the coolant passageways 22 and 24 of the mounting table 12, the approximately uniform (flat) temperature distribution was obtained in the central region and the peripheral region of the mounting table 12, as shown in FIG. 18. Accordingly, it can be concluded that the temperature of the peripheral region of the semiconductor wafer W on the mounting table 12 tends to be higher than that of the central region thereof due to the heat radiation from the plasma and the chamber wall and the like.

Next, a second example will be described with reference to FIG. 19. In this example, wiring having a fine width was formed by processing a multilayer film formed on the main surface of the semiconductor wafer W, e.g., a two-layer conductive film. In this case, a sequence for switching the temperature control mode (B) (see FIGS. 6 and 7) to the mode (D) (see FIGS. 10 and 11) was effective.

In etching of the conductive layer, a gaseous mixture containing, for example, a chlorine-based halide was used as an etching gas. Further, when the temperature of the mounting table 12 was controlled, at the beginning, as shown in FIG. 19, the temperature of the entire semiconductor wafer W was controlled at a desired set temperature in an approximately uniform distribution by executing the mode B. In this case, the temperature of the semiconductor wafer W was able to be raised up to a first set temperature (e.g., 60° C.) at a high response speed due to the function of raising a temperature at high speed. In this state, by introducing the etching gas into the chamber 90 and exciting the plasma by the high frequency power, an upper conductive layer was processed.

Next, by temporarily suspending the introduction of the etching gas, the mode for controlling the temperature of the mounting table 12 was switched from the mode (B) to the mode (D). Also in this case, the temperature of the entire mounting table 12 was able to be rapidly lowered to a second set temperature (e.g., 30° C.) corresponding to the base temperature due to the function of lowering a temperature at high speed.

Figure 19:
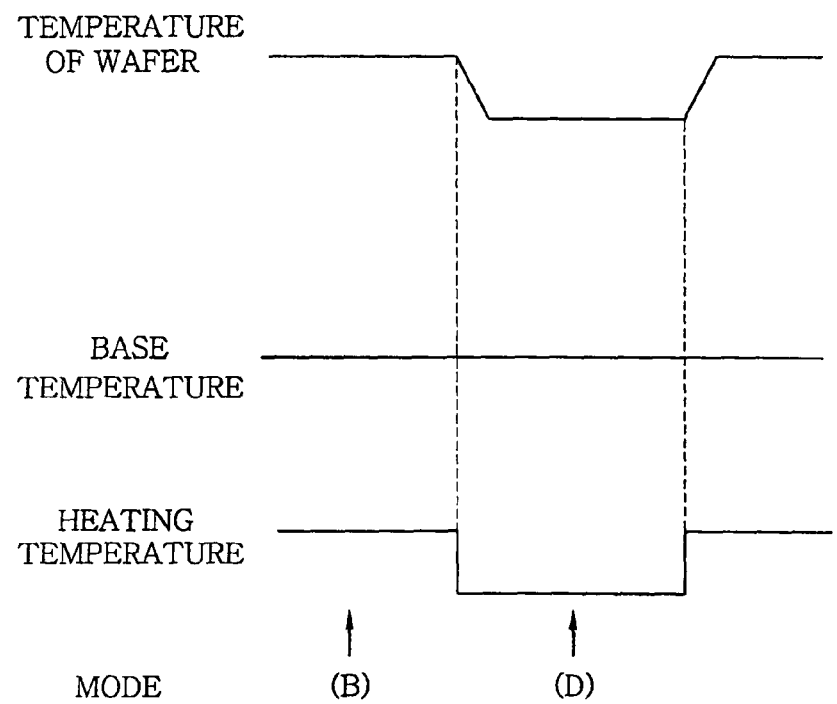
FIG. 19 shows a sequence for converting a temperature control mode in accordance with the second preferred embodiment of the present invention.

Thus, by switching the mode (B) to the mode (D), as shown in FIG. 19, the temperature of the entire semiconductor wafer W was lowered at high speed. In this state, by introducing the etching gas into the chamber 90 again and exciting the plasma, a lower conductive layer was processed. As a result, it was possible to form a laminated wiring whose dimension was controlled with high accuracy.

Figure 20:
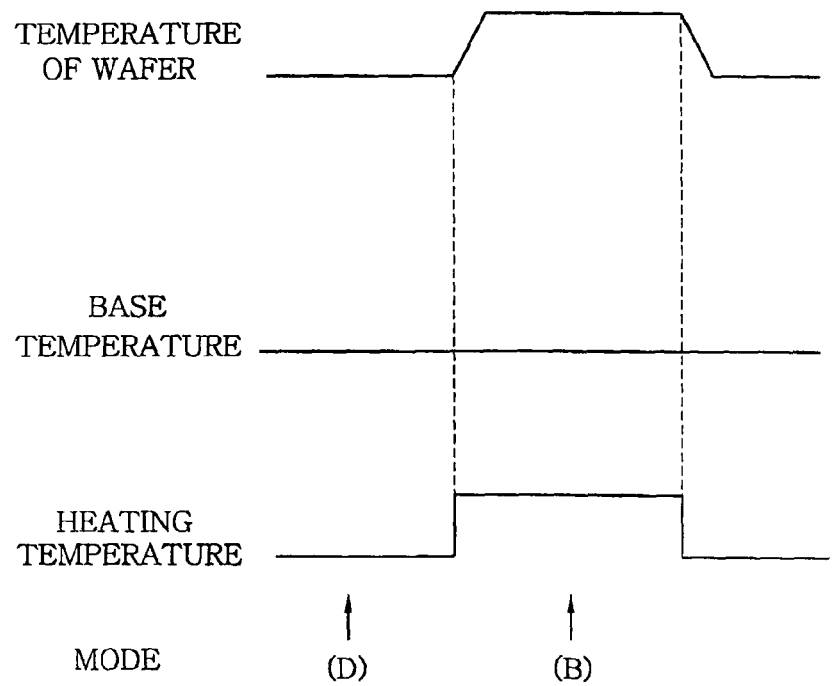
FIG. 20 offers another sequence for converting a temperature control mode in accordance with the second preferred embodiment of the present invention.

In addition, various temperature control sequences was able to be executed during the plasma processing. FIG. 20 illustrates a reverse sequence to that shown in FIG. 19. To be specific, an upper layer of the multilayer film was processed under the mode (D) and, then, a lower layer was processed under the mode (B). Also in this case, it was possible to switch the temperature of the mounting table 12 from the set temperature (e.g., 30° C.) in the mode (D) to that (e.g., 60° C.) in the mode (B) at high speed.

Figure 21:
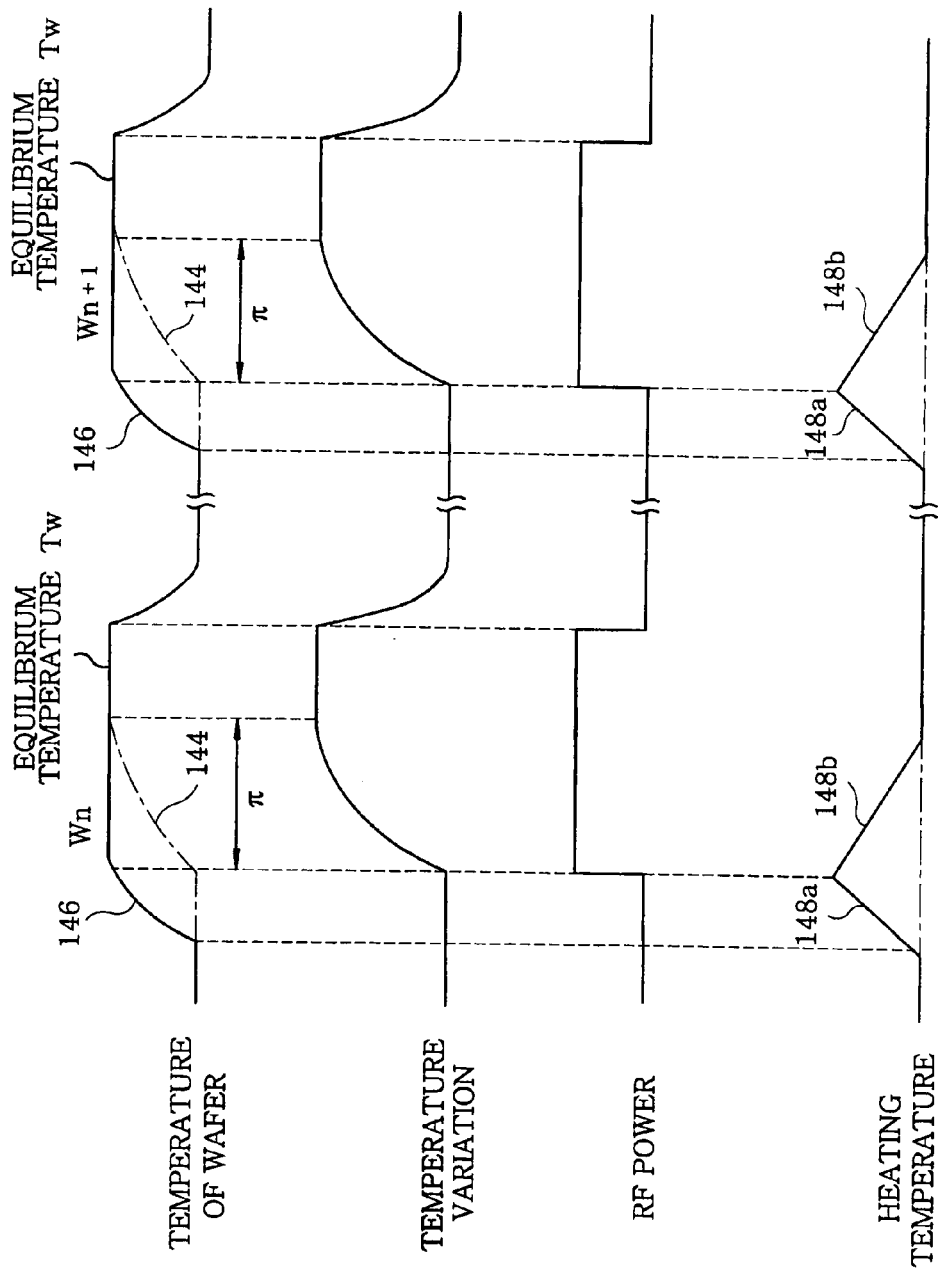
FIG. 21 illustrates a method for controlling a temperature of an object to be processed in accordance with the second preferred embodiment of the present invention.

FIG. 21 presents a third example. In the plasma processing apparatus, as described above, a substrate to be processed on the mounting table was subjected to heat radiation from the plasma and the chamber wall and incidence of high density electrons during the plasma processing. Accordingly, when the plasma processing was initiated and, simultaneously, the high frequency (radio frequency (RF)) power was supplied to the high frequency electrode, a temperature of the substrate rose as shown by a dashed dotted line 144 of FIG. 21. Meanwhile, due to the temperature control function of the mounting table, the temperature increase (change) of the substrate was saturated after a specified time period $\pi$ had elapsed and an equilibrium temperature Tw was obtained. However, this could not maintain the temperature of the substrate at a preset processing temperature (temperature condition of recipe)

during the entire period of the plasma processing, whereby it was unreliable in reproducibility of the plasma processing and a production yield.

Considering this point, in accordance with the present invention, before a desired plasma processing is started after the semiconductor wafer W loaded into the chamber 10 is mounted on the mounting table 12, a coolant flowing in the line 26 is heated by the heating unit 16 due to its function of raising/lowering a temperature at high speed, whereby a temperature of each of semiconductor wafers Wn is raised to a preset processing temperature Tw at high speed as shown by solid lines 148a and 146 of FIG. 21. Then, the heating for the coolant flowing in the line 26 by the heating unit 16 is gradually reduced as shown by a solid line 148b of FIG. 21, so that the temperature of the semiconductor wafers Wn can be substantially maintained at the preset processing temperature Tw from the start until the end of processing. Consequently, it is possible to compensate the wafer temperature change (increase) caused by the heat from the plasma or the like and further to improve temperature management, reproducibility and a production yield in plasma processing of a single wafer.

In the aforementioned embodiment, the base temperature of the coolant in the chiller unit 14 is maintained at a constant in the sequence for switching the temperature control mode. However, the present invention is not limited thereto. That is, the base temperature can be arbitrarily changed by the heater 38 in the chiller unit 14. Moreover, by variably controlling the base temperature and utilizing the temperature increasing/decreasing function of the heating unit 16, the temperature can be more variously controlled.

Figure 22:
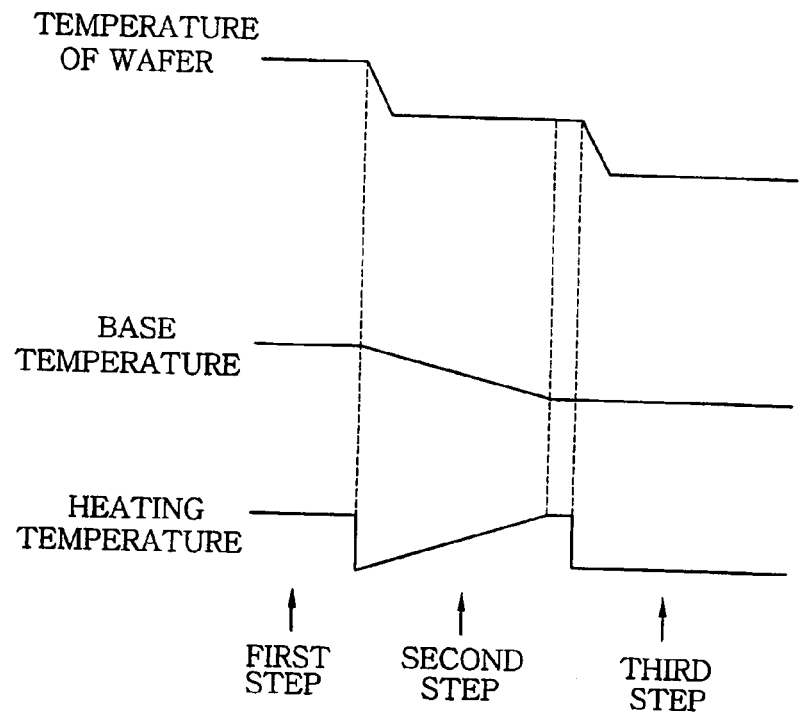
FIG. 22 provides a sequence for converting a temperature control mode in accordance with the second preferred embodiment of the present invention.

For instance, FIG. 22 shows an example of lowering a temperature of the semiconductor wafer W in three steps. As described above, since the chiller unit 14 has a large thermal capacity and is installed considerably far from the mounting table 12, a considerably long time is required (low response speed) until a temperature of the mounting table 12 reaches the base temperature changed in the chiller unit 14.

Therefore, as illustrated in FIG. 22, in a first step, the base temperature is set comparatively high and, also, a temperature of the coolant is maintained at a fixed temperature much higher than the base temperature by turning on the heating unit 16, thereby maintaining the temperature of the semiconductor wafer W at a first set temperature. Next, in a second step, the base temperature is switched to a reference temperature lower than its original temperature in the chiller unit 14. However, due to a large time constant in switching the base temperature, the temperature of the coolant supplied to the mounting table 12 is gradually lowered and the temperature of the semiconductor wafer W is also gradually lowered, so that it is difficult to realize a high-speed temperature switching. Thus, in the second step, by suspending the heating operation of the heating unit 16, the temperature of the semiconductor wafer W is rapidly lowered to the second set temperature lower than the first set temperature. Thereafter, by resuming the heating operation of the heating unit 16, the temperature controller 54 slightly raises the heating temperature in step with the time constant of the base temperature. Consequently, the semiconductor wafer W is maintained at the second set temperature during the second step. Next, when the base temperature reaches a new reference value, the heating operation of the heating unit 16 is stopped. Accordingly, the temperature of the semiconductor wafer W can be quickly reduced from the second set temperature to a third set temperature corresponding to a new base temperature.

In this manner, the temperature of the semiconductor wafer W is maintained, for example, at 90° C. in the first step; at 60° C. in the second step; and at 30° C. in the third step. As a result, for example, an etching process can be performed on a three-layer film with high accuracy. Besides, a single layer film can be processed to have a desired profile.

Figure 23:
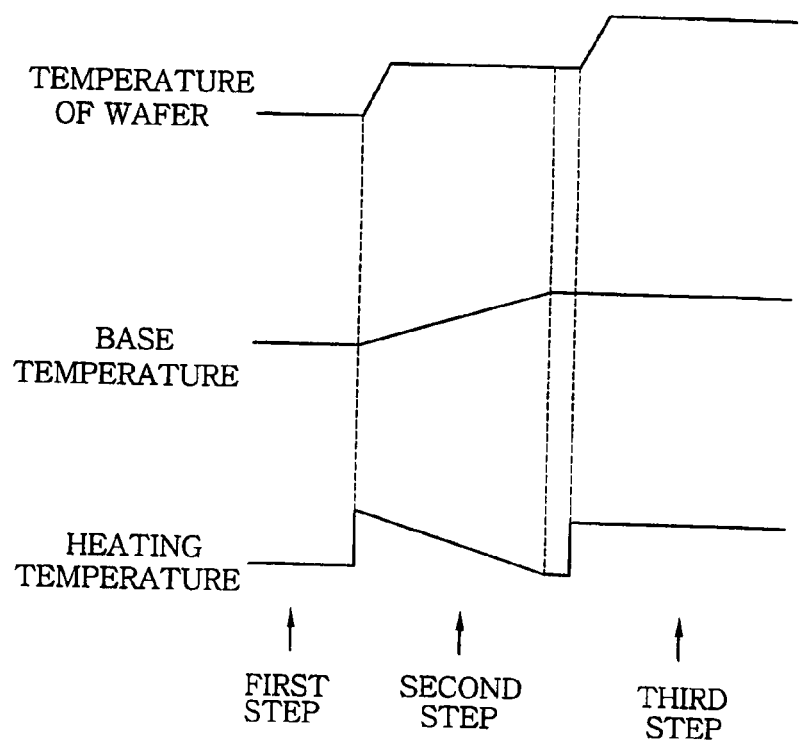
FIG. 23 presents a sequence for converting a temperature control mode in accordance with the second preferred embodiment of the present invention.

FIG. 23 illustrates a reverse sequence to the temperature control sequence described in FIG. 22, i.e., a sequence for increasing a temperature of the semiconductor wafer W in three steps. In accordance with this sequence, the temperature of the semiconductor wafer W is maintained, for example, at 30° C. in the first step; at 60° C. in the second step; and at 90° C. in the third step. As a result, a multi-layer film can be etched with high accuracy as in the example of FIG. 22.

Figure 24:
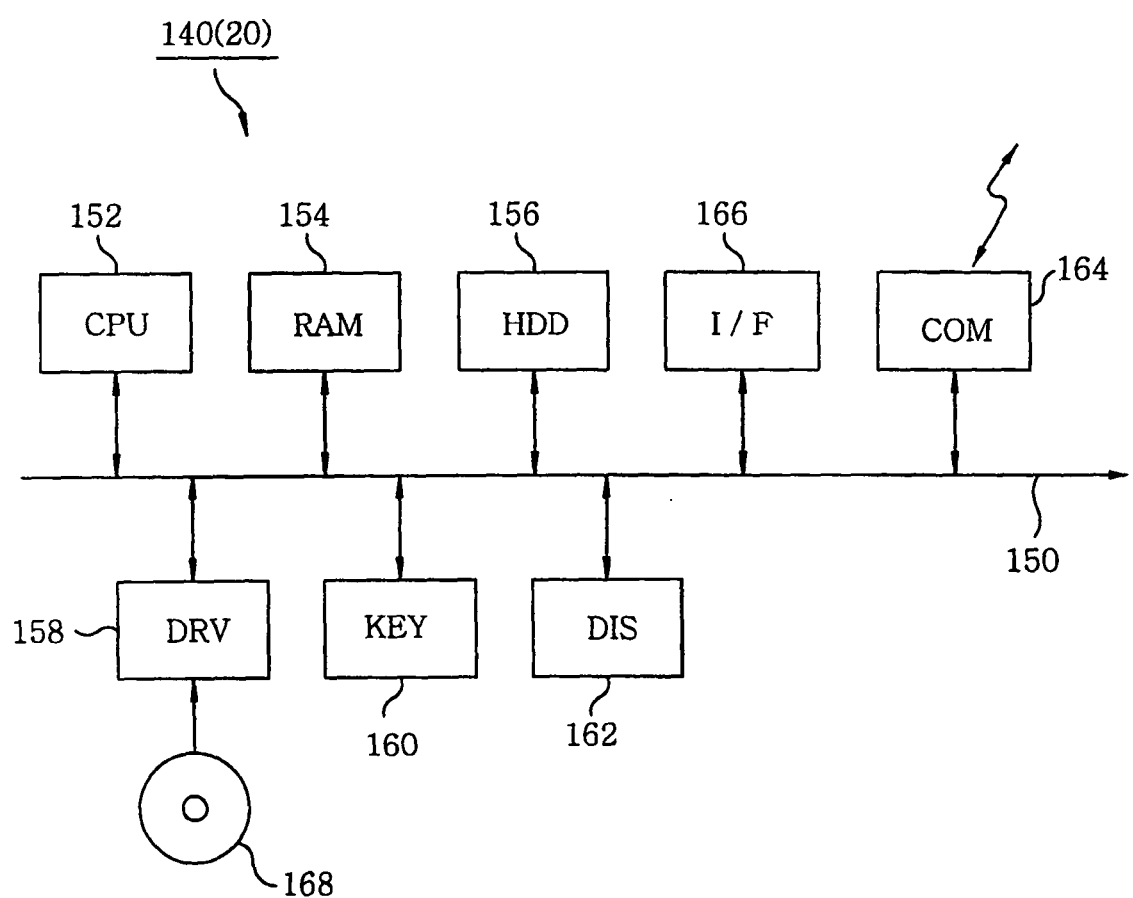
FIG. 24 is a block diagram describing a composition of a controller in accordance with the second preferred embodiment of the present invention.

FIG. 24 represents a configuration example of a controller 140 (controller 20). In this example, the controller 140 (controller 20) includes a processor (CPU) connected via a bus 150, a memory (RAM) 154, a program storage (HDD) 156, a disk drive (DRV) 158 such as a floppy disk drive and an optical disk drive, an input device (KEY) such as a keyboard and a mouse, a display device (DIS) 162, a network•interface (COM) 164 and a peripheral interface (I/F) 166.

The processor (CPU) 152 reads a code of a required program from a storage medium 168, e.g., an FD, an optical disk or the like, loaded in the disk drive (DRV) 158 and then stores the code in the HDD 156. Besides, the required program can be downloaded from a network via the network•interface (COM) 164. Further, the processor (CPU) 152 reads the program code required in each step from the HDD 156 to be provided on the working memory RAM 154, thereby executing each step and a required operation processing. Accordingly, each unit (especially, the chiller unit 14, the heating unit 16, the channel switching unit 18 or the like) in the apparatus is controlled via the peripheral interface 166. Such a computer system implements every program for executing the method for controlling a temperature of a mounting table in accordance with the first and the second embodiment.

While the invention has been shown and described with respect to the preferred embodiments, it will be understood by those skilled in the art that various changes and modification may be made without departing from the scope of the invention as defined in the following claims.

For example, in the channel switching unit 18, a pair of solenoid valves 62 and 64 can be replaced by a single direction switching valve having a first port connected to the first inlet 18a and a second and a third port respectively connected to the first and the second outlet 18c and 18d. Moreover, the pair of solenoid valves 66 and 68 can be replaced by a single direction switching valve having a first port connected to the second inlet 18a and a second and a third port respectively connected to the first and the second outlet 18c and 18d. However, in this case, it is not possible to realize the modes (C) and (F).

In the above-mentioned embodiment, instead of the heating unit 16, a cooling unit for cooing a coolant can be provided in the middle of the line 26. In this case, for example, a temperature distribution of the semiconductor wafer W in the mode (A) can have an inverse profile to that shown in FIG. 17. Additionally, it is possible to make the coolant of a base temperature outputted from the chiller unit 14 flow in the coolant passageway 24 of the peripheral region of the mounting table 12 and serially flow it in the coolant passageway 22 of the central region thereof. Further, the mounting table 12 can have more than three coolant passageways having their own inlets and outlets.

Besides, the present invention can be equally applied to a processing apparatus for exciting a helicon wave plasma, that for exciting an electron cyclotron resonance (ECR) plasma, that for exciting μ-wave plasma, that for exciting an inductively coupled plasma (ICP) or the like, in addition to a parallel plate plasma processing apparatus. Furthermore, the present invention can be equally applied to a film forming apparatus or the like, e.g., a chemical vapor deposition (CVD) apparatus, a plasma CVD apparatus, a sputtering device, an MBE apparatus, a deposition device or the like, in addition to the etching apparatus. Moreover, the present invention can be equally applied to ion milling, processing for an object to be processed using FIB, plasma cleaning on an insulating substrate surface, plasma cleaning or the like.

Further, a substrate to be processed in the present invention may include various substrates for a flat panel display, a photomask, a CD substrate or the like without being limited to the semiconductor wafer.

What is claimed is:

1. A method for controlling a temperature of a mounting table by circulating a coolant coming out of a coolant circulator in a first and a second coolant passageway provided at the mounting table for mounting thereon a target object, the method comprising a first temperature control mode and a second temperature control mode, wherein the first temperature control mode includes the steps of:
connecting the first coolant passageway and the second coolant passageway in parallel between an output port and a return port of the coolant circulator;
making a part of the coolant of a reference temperature outputted from the coolant circulator flow in the first coolant passageway after raising or lowering the temperature thereof to a desired set temperature; and
making a residual coolant flow in the second coolant passageway while substantially maintaining the reference temperature thereof, wherein the second temperature control mode includes the steps of:
connecting the first coolant passageway and the second coolant passageway in parallel between the output port and the return port of the coolant circulator;
making a part of the coolant outputted from the coolant circulator flow in the first coolant passageway while substantially maintaining the reference temperature thereof; and
making a residual coolant flow in the second coolant passageway while substantially maintaining the reference temperature thereof, wherein the first and the second temperature control mode may be switched depending on processing conditions for the target object.

2. The method of claim 1, further comprising a third temperature control mode including the steps of:
connecting the first coolant passageway and the second coolant passageway in series between the output port and the return port of the coolant circulator;
making a part of the coolant of a reference temperature outputted from the coolant circulator flow in the first and the second coolant passageway sequentially after raising or lowering the temperature thereof to a desired set temperature; and
making a residual coolant bypass the coolant passageways,
wherein the first to the third temperature control mode may be switched depending on processing conditions for the target object.

3. The method of claim 1, further comprising a fourth temperature control mode including the steps of:
connecting the first coolant passageway and the second coolant passageway in series between the output port and the return port of the coolant circulator; and
making the entire coolant of the reference temperature outputted from the coolant circulator flow in the first and the second coolant passageway sequentially after raising or lowering the temperature thereof to a desired set temperature;
wherein the first, the second and the fourth temperature control mode may be switched depending on processing conditions for the target object.

4. The method of claim 2, further comprising a fifth temperature control mode including the steps of:
connecting the first coolant passageway and the second coolant passageway in series between the output port and the return port of the coolant circulator;
making a part of the coolant outputted from the coolant circulator flow in the first and the second coolant passageway sequentially while substantially maintaining the reference temperature thereof; and
making a residual coolant bypass the coolant passageways,
wherein the first, the third, and the fifth temperature control mode may be switched depending on processing conditions for the target object.

5. The method of claim 3, further comprising a fifth temperature control mode including the steps of:
connecting the first coolant passageway and the second coolant passageway in series between the output port and the return port of the coolant circulator;
making a part of the coolant outputted from the coolant circulator flow in the first and the second coolant passageway sequentially while substantially maintaining the reference temperature thereof; and
making a residual coolant bypass the coolant passageways,
wherein the first, the fourth, and the fifth temperature control mode may be switched depending on processing conditions for the target object.

6. The method of claim 2, further comprising a sixth temperature control mode including the steps of:
connecting the first coolant passageway and the second coolant passageway in series between the output port and the return port of the coolant circulator; and
making the entire coolant outputted from the coolant circulator flow in the first and the second coolant passageway sequentially while substantially maintaining the reference temperature thereof,
wherein the first, the third, and the sixth temperature control mode may be switched depending on processing conditions for the target object.

7. The method of claim 3, further comprising a sixth temperature control mode including the steps of:
connecting the first coolant passageway and the second coolant passageway in series between the output port and the return port of the coolant circulator; and
making the entire coolant outputted from the coolant circulator flow in the first and the second coolant passageway sequentially while substantially maintaining the reference temperature thereof,
wherein the first, the fourth, and the sixth temperature control mode may be switched depending on processing conditions for the target object.

8. A method for controlling a temperature of a mounting table by circulating a coolant with a coolant circulator in a first and a second coolant passageway provided at the mounting table for mounting thereon a target object, the method comprising:
a first temperature control mode for controlling the temperature of the mounting table by connecting the first coolant passageway and the second coolant passageway in parallel between an output port and a return port of the coolant circulator, making a part of the coolant of a reference temperature outputted from the coolant circulator flow in the first coolant passageway after raising or lowering the temperature thereof to a desired set temperature, and making a residual coolant flow in the second coolant passageway while substantially maintaining the reference temperature thereof;

a second temperature control mode for controlling the temperature of the mounting table by connecting the first coolant passageway and the second coolant passageway in parallel between the output port and the return port of the coolant circulator, making a part of the coolant outputted from the coolant circulator flow in the first coolant passageway while substantially maintaining the reference temperature thereof, and making a residual coolant flow in the second coolant passageway while substantially maintaining the reference temperature thereof;

a third temperature control mode for controlling the temperature of the mounting table by connecting the first coolant passageway and the second coolant passageway in series between the output port and the return port of the coolant circulator, and making a part of the coolant of a reference temperature outputted from the coolant circulator flow in the first and the second coolant passageway sequentially after raising or lowering the temperature thereof to a desired set temperature, and making a residual coolant bypass the coolant passageways;

a fifth temperature control mode for controlling the temperature of the mounting table by connecting the first coolant passageway and the second coolant passageway in series between the output port and the return port of the coolant circulator, making a part of the coolant outputted from the coolant circulator flow in the first and the second coolant passageway sequentially while substantially maintaining the reference temperature thereof, and bypassing a residual coolant, wherein the method performs a switching between the first mode and at least one of the second, the third and the fifth mode.

* * * * *